United States Patent
Kanemoto et al.

(12) 
(10) Patent No.: US 6,924,547 B2
(45) Date of Patent: Aug. 2, 2005

(54) MEMORY CARD

(75) Inventors: Kouichi Kanemoto, Higashiyamato (JP); Masachika Masuda, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/443,956

(22) Filed: May 23, 2003

(65) Prior Publication Data

US 2003/0227075 A1 Dec. 11, 2003

(30) Foreign Application Priority Data

Jun. 10, 2002 (JP) ......................................... 2002-169144

(51) Int. Cl.⁷ ............................................. H01L 23/495
(52) U.S. Cl. ....................................... 257/666; 257/667
(58) Field of Search ................................ 257/666, 667, 257/668, 672, 678, 676, 673; 235/492

(56) References Cited

U.S. PATENT DOCUMENTS 6,018,461 A * 1/2000 Biermann et al. .......... 361/737
6,444,501 B1 * 9/2002 Bolken ....................... 438/127
2003/0029920 A1 * 2/2003 Chhor et al. ................ 235/492

FOREIGN PATENT DOCUMENTS

JP  2001-217383  8/2001

* cited by examiner

*Primary Examiner*—David Nelms
*Assistant Examiner*—Thinh T Nguyen
(74) *Attorney, Agent, or Firm*—Miles & Stockbridge P.C.

(57) ABSTRACT

A memory card is disclosed which not only suppresses a lowering of the manufacturing yield caused by warping of a semiconductor chip sealing member, but also reduces the manufacturing cost by using a less expensive material. The memory card comprises a thin plate-like cap formed of a synthetic resin and a sealing member mounted inside the cap. Inside the sealing member are sealed a metallic lead frame and three semiconductor chips (two memory chips and one control chip) mounted on part (leads) of the lead frame. The semiconductor chips are electrically connected to leads through Au wires. Connecting terminals integral with the lead frame are exposed to the back side of the sealing member.

14 Claims, 35 Drawing Sheets

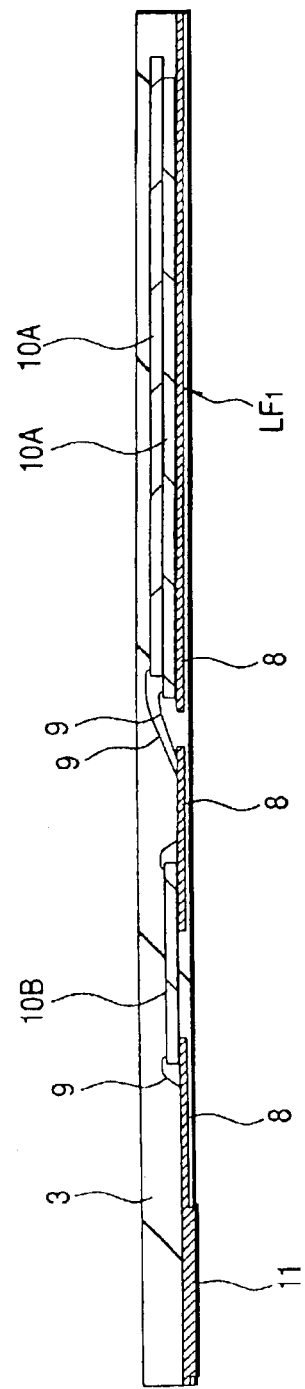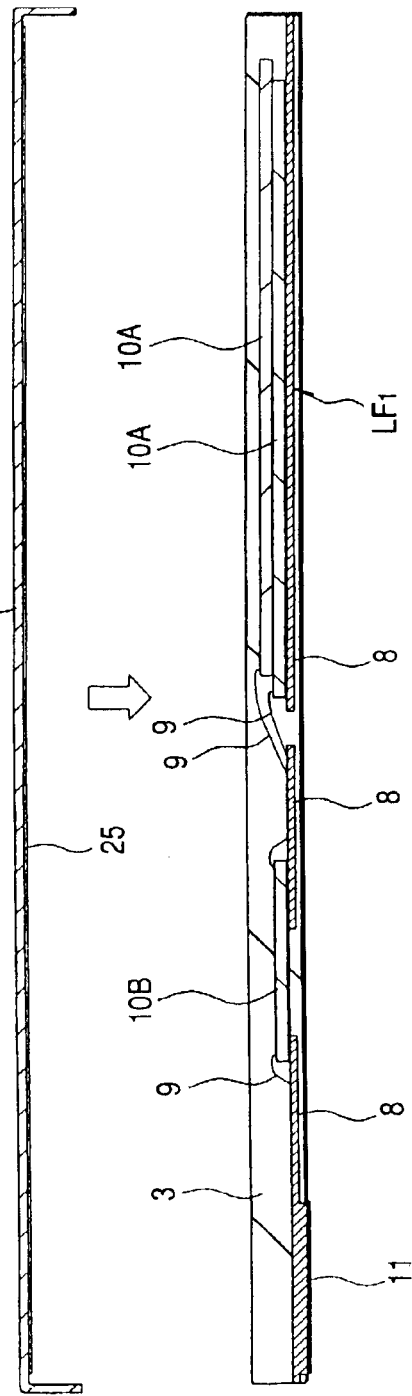

MEMORY CARD

BACKGROUND OF THE INVENTION

The present invention relates to a memory card and a technique for manufacturing the same. Particularly, the invention is concerned with a technique which permits improvement of the memory card manufacturing yield and reduction of the manufacturing cost.

As data storage mediums for digital devices such as digital video cameras, portable telephones, and portable music players, memory cards each incorporating a memory chip therein are in wide use.

The memory cards are 32 mm long by 24 mm wide, 1.2 mm to 1.4 mm thick, and are thus characterized by being extremely small-sized and light-weight. Upon insertion of a memory card into a memory slot formed in a digital device, there is made access to the device and write and read of data are executed.

As described for example in Japanese Published Unexamined Patent Application No. 2001-217383, memory cards of this type have a structure wherein a memory chip mounted on a surface of a wiring substrate is sealed with an insulating resin to form a sealing member and the sealing member is covered with a cap. A back side of the wiring substrate not covered with the cap constitutes a back side of the memory card, and on part of the back side there are formed connecting terminals which are electrically connected to the memory chip. When the memory card is inserted into a slot formed in a digital device, the connecting terminals and a connector of the slot are connected together electrically and read and write of data are executed.

SUMMARY OF THE INVENTION

According to studies made by the present inventors it has turned out that the following problems are involved in the memory cards of such a conventional structure as described above.

Firstly, in the memory cards of the conventional structure, since a memory chip mounted on a surface of the wiring substrate is sealed with an insulating resin to form a sealing member, there occurs a warp of the wiring substrate due to a difference in thermal expansion coefficient between the wiring substrate and the insulating resin, with consequent deterioration in appearance of the memory cards and lowering of the manufacturing yield.

Particularly, in recent memory cards, plural memory chips are stacked on a wiring substrate in order to increase the memory capacity. Consequently, the thickness of the insulating resin which seals the memory chips becomes smaller. As a result, the wiring substrate is apt to be warped due to a difference in thermal expansion coefficient between the wiring substrate and the insulating resin.

Secondly, since the wiring substrate for a memory card is constituted by a resin substrate such as glass fabric-based epoxy resin board or BT resin board with Cu wiring lines formed on both sides thereof, its manufacturing cost is relatively high, which is a restriction in attaining reduction of the memory card manufacturing cost.

It is an object of the present invention to provide a technique which permits improvement of the memory card manufacturing yield.

It is another object of the present invention to provide a technique which permits reduction of the memory card manufacturing cost.

The above and other objects and novel features of the present invention will become apparent from the following description and the accompanying drawings.

Typical modes of the present invention as disclosed herein will be outlined below.

A memory card according to the present invention comprises a lead frame, a sealing member which seals one or more semiconductor chips with an insulating resin, the semiconductor chips being mounted on the lead frame and connected electrically to leads of the lead frame through wires, a cap which covers a main surface and side faces of the sealing member, and connecting terminals integral with the lead frame and exposed to the exterior from a back side of the sealing member.

According to the memory card of the present invention constructed as above, since both upper and lower sides of the semiconductor chips are covered with the insulating resin, it is possible to prevent or suppress warping of the sealing member.

Further, since there is adopted a lead frame which is less expensive than the multi-layer wiring substrate used in conventional memory cards, it is possible to reduce the memory card manufacturing cost.

BRIEF DESCRIPTION OF THE DRAWINGS

FIG. 21 is a sectional view of a sealing member, showing how to manufacture the memory card of the first embodiment;

FIG. 22 is a sectional view of the sealing portion and a cap, showing how to manufacture the memory card of the first embodiment;

DETAILED DESCRIPTION OF THE PREFERRED EMBODIMENTS

Figure 1:
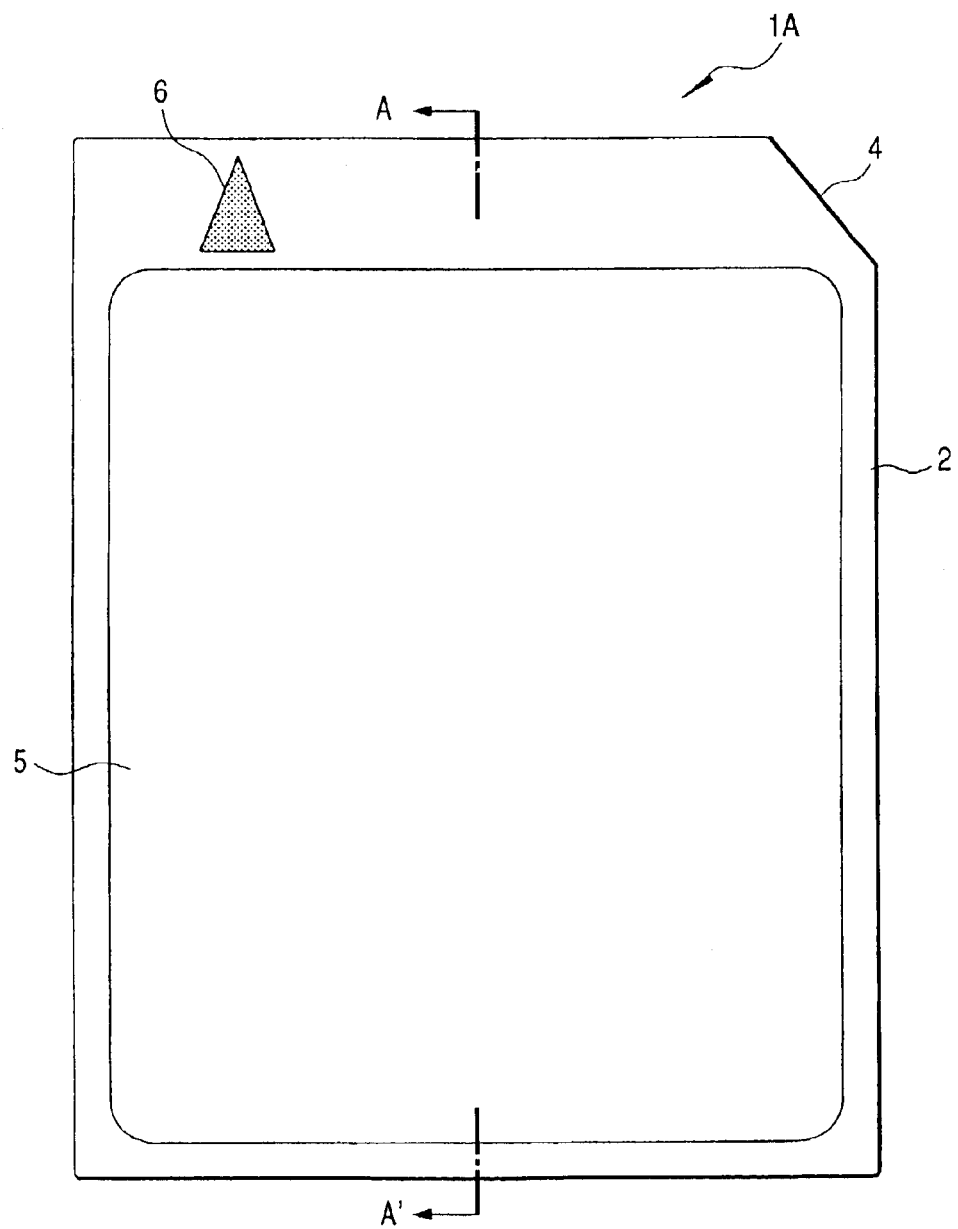
FIG. 1 is a plan view (surface side) of a memory card according to a first embodiment of the present invention.

Embodiments of the present invention will be described in detail hereinunder with reference to the accompanying drawings. In all of the drawings for illustration of the embodiments, the same members are identified by the same reference numerals in principle, and repeated explanations thereof will be omitted.

(First Embodiment)

Figure 2:
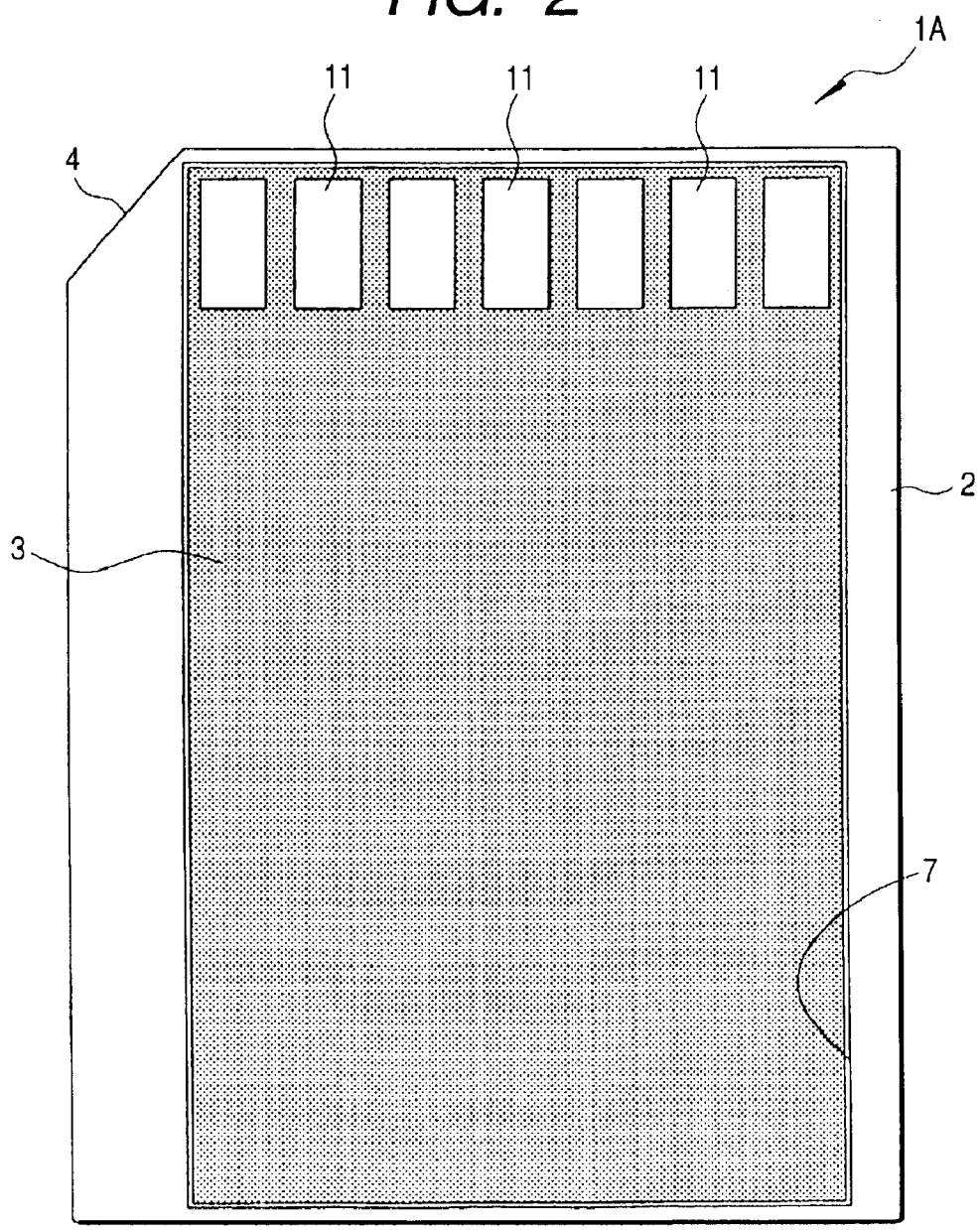
FIG. 2 is a plan view (back side) thereof.
Figure 3:
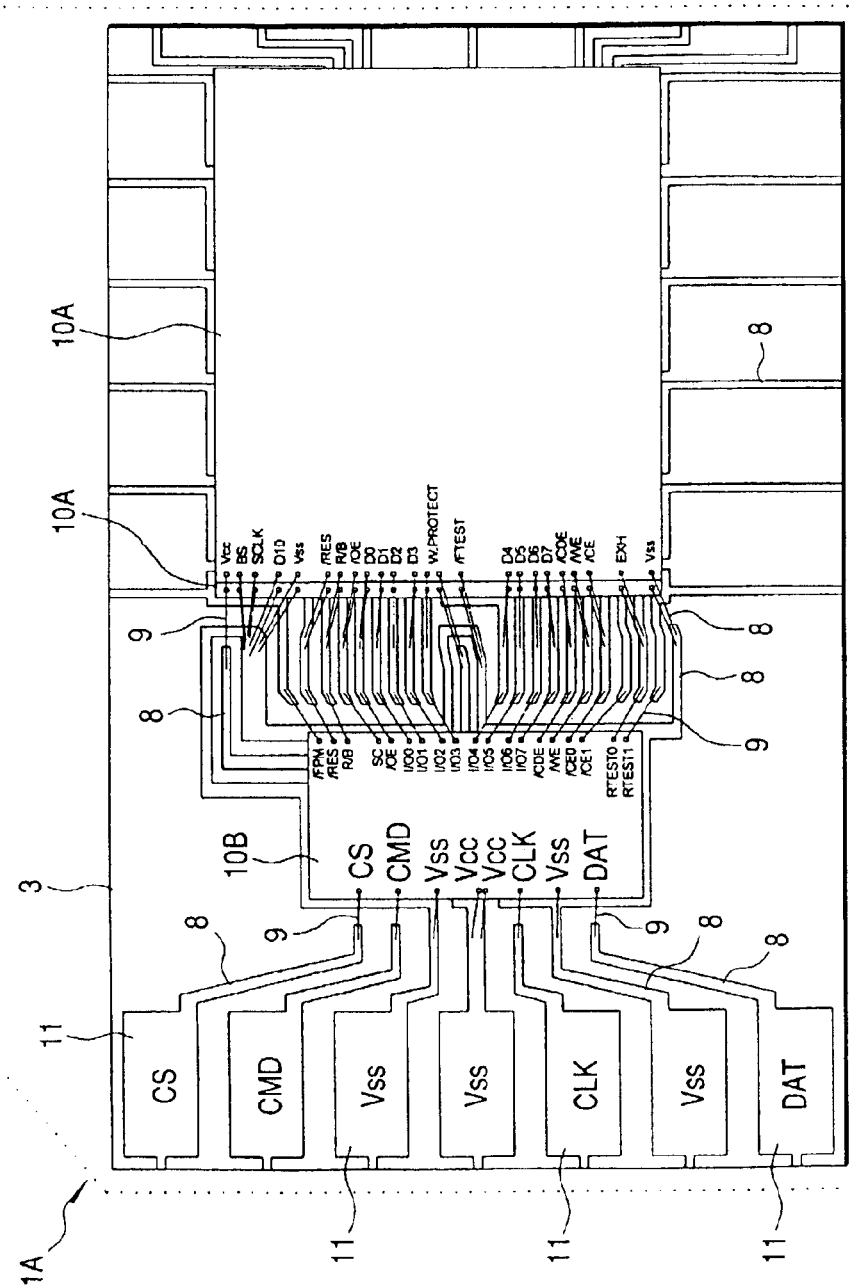
FIG. 3 is a plan view showing an internal structure and an array of pins in the memory card of the first embodiment.
Figure 4:
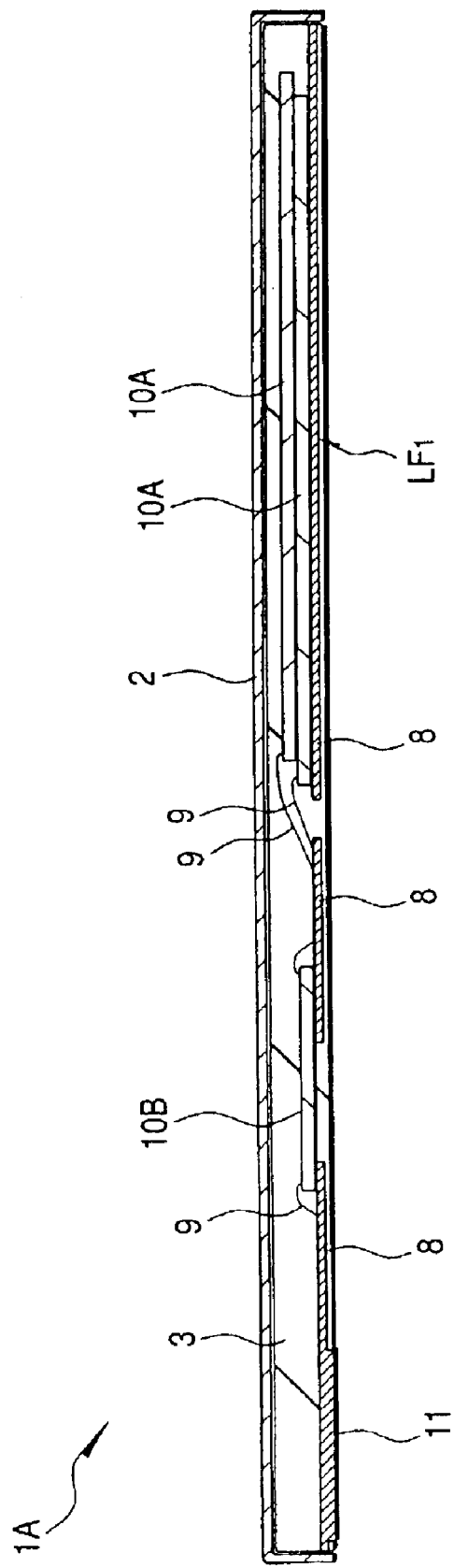
FIG. 4 is a sectional view taken along line A—A' in FIG. 1.

In this first embodiment the present invention is applied to a memory card (e.g., a multi-media card having a memory capacity of 128 mega bytes) on which are mounted a memory chip and a control chip for controlling the memory chip. FIGS. 1 and 2 are plan views (surface side and back side, respectively) of the memory card, FIG. 3 is a plan view showing an internal structure and an array of pins in the memory card, and FIG. 4 is a sectional view taken along line A–A' in FIG. 1.

A memory card 1A is made up of a thin plate-like cap 2 formed of a synthetic resin such as polyphenyl ether and a sealing member 3 formed inside the cap 2. The cap 2 is in a rectangular shape having a length of 32 mm, a width of 24 mm and a thickness of 1.4 mm, with an oblique cutout portion 4 being formed in one corner thereof.

A surface of the cap 2 serves as a surface of the memory card 1A, and label 5 describing the specification, etc. of the memory card 1A is affixed to a central portion of the cap surface. An index mark 6 is formed at one end portion of the cap surface. By visually checking the position of the index mark 6 or the cutout portion 4 it is possible to easily determine a correct direction in which the memory card 1A is to be inserted into a slot formed in a digital device.

A rectangular groove 7 is formed in a back side of the cap 2 and the sealing member 3 formed of an insulating resin such as an epoxy resin by transfer molding is fitted in the groove 7. The sealing member 3 is in a rectangular shape having a length of 30 mm, a width of 21 mm and a thickness of 1 mm and is fixed to the interior of the groove 7 with one side thereof bonded to an inner surface of the cap 2. In the interior of the sealing member 3 are sealed a metallic lead frame $LF_1$ and three semiconductor chips (two memory chips 10A and a control chip 10B) mounted on a portion (leads 8) of the lead frame $LF_1$.

The two memory chips 10A have the same external size and flash memories each having a memory capacity of 512 mega bits (=64 mega bytes) are formed on main surfaces, respectively, of the memory chips. The two memory chips 10A are mounted on the leads 8 in such a state that one is stacked on the other. Further, plural bonding pads BP are formed in a row along one side of a main surface of each of the two memory chips 10A. The bonding pads BP and the leads 8 are electrically connected together through Au wires 9.

The control chip 10B is mounted on the lead frame $LF_1$ (leads 8) at a position close to the memory chips 10A. Plural bonding pads BP are formed in a row along two opposed long sides of a main surface of the control chip 10B. The bonding pads BP and the leads 8 are electrically connected together through Au wires 9.

A back side of the sealing member 3 serves as a back side of the memory card 1A, and in the vicinity of one end portion thereof are formed plural connecting terminals 11 for electric connection between the memory card 1A and the digital device. When the memory card 1A is inserted into the slot of the digital device, the connecting terminals and a connector of the slot are connected together electrically, whereby read of data stored in the memory chips 10A or write of data into the memory chips 10A is executed.

In the memory card 1A of this embodiment, the connecting terminals 11 are integral with the lead frame $LF_1$. A metallic plate which constitutes the lead frame $LF_1$ is thick (about 200 to 250 µm) at its portion where the connecting terminals 11 are formed and are thin at the other portion (leads 8), so that only the portion of the connecting terminals 11 is exposed to the exterior of the sealing member 3.

Thus, in the memory card 1A of this embodiment, the lead frame $LF_1$ is used in place of the wiring substrate used in the conventional memory card and semiconductor chips (two memory chips 10A and a control chip 10B) mounted on the lead frame $LF_1$ are sealed with an insulating resin to constitute the sealing member 3.

Figure 5:
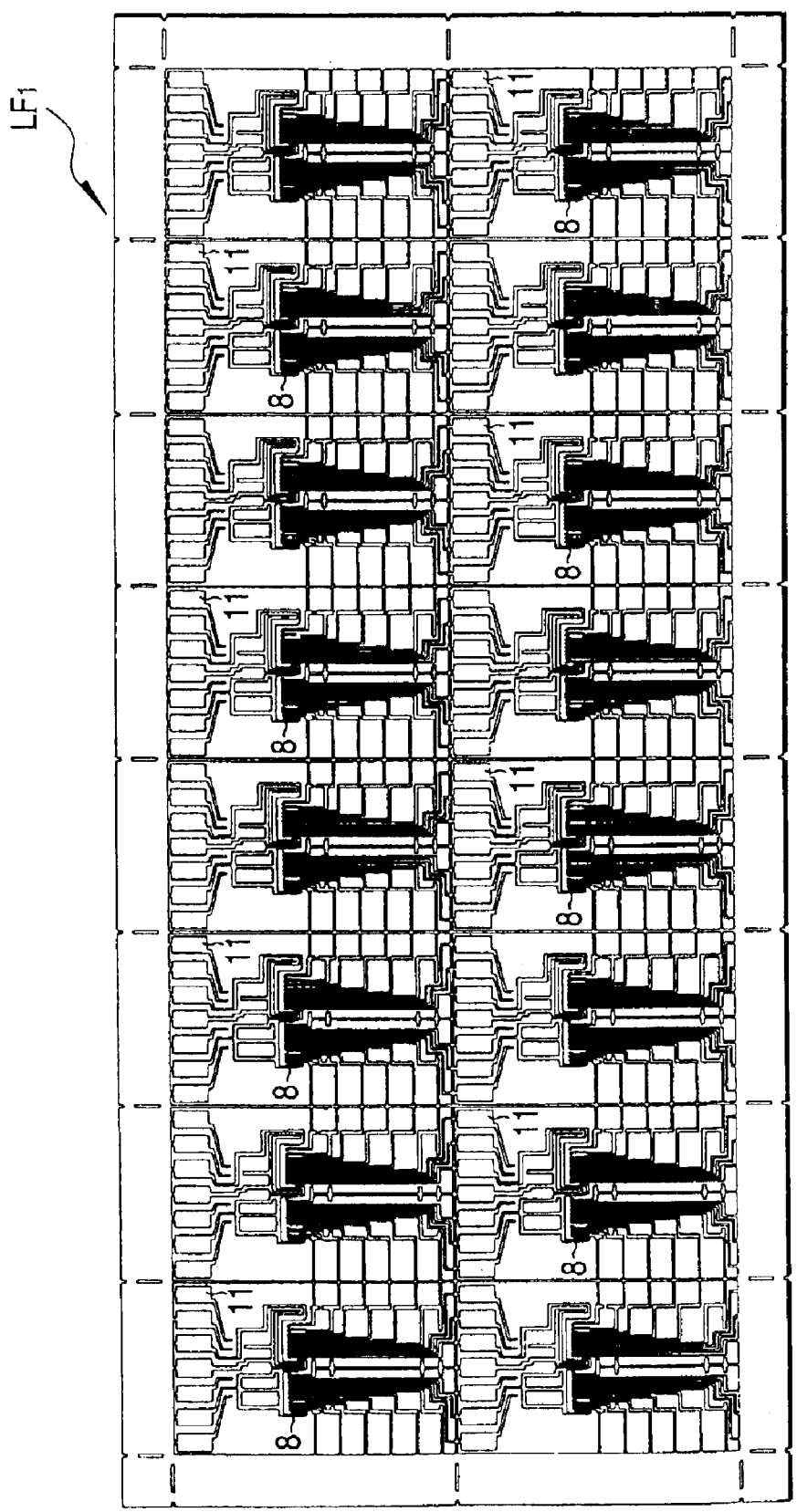
FIG. 5 is a plan view of the whole of a lead frame used in manufacturing the memory card of the first embodiment.

FIG. 5 is a plan view of the whole of the lead frame $LF_1$ used in manufacturing the memory card 1A. The lead frame $LF_1$ has a multi-frame structure in which patterns such as the leads 8 and the connecting terminals 11 are formed repeatedly in both longitudinal and transverse directions. For example, semiconductor chips corresponding to sixteen memory cards (1A) can be mounted on the lead frame $LF_1$.

Figure 6:
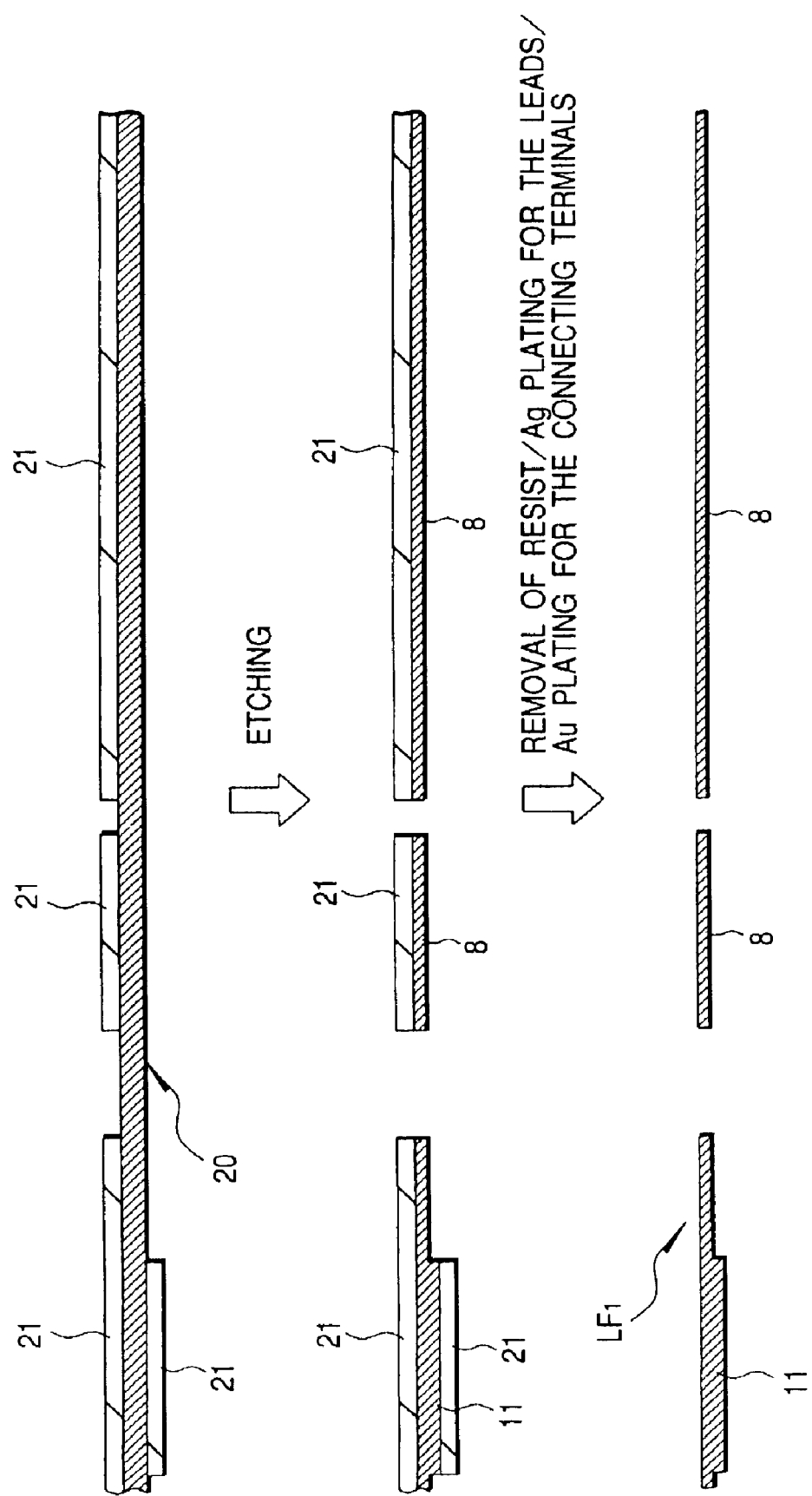
FIG. 6 is a sectional view illustrating how to fabricate the lead frame shown in FIG. 5.

For fabricating the lead frame $LF_1$ there is provided such a metallic plate (hoop) 20 of Cu, Cu alloy, or Fe—Ni alloy as shown in FIG. 6, which has a thickness of about 200 to 250 µm. Then, a photoresist film 21 is formed on one side of the metallic plate 20 in a region where the leads 8 are to be formed, while in a region where the connecting terminals 11 are to be formed there is formed the photoresist film 21 on both sides of the metallic plate 20. In this state, the metallic plate 20 is etched (half-etching) with a chemical liquid to thin the plate thickness to about half (100 to 125 µm or so) of the original plate thickness in the region where the photoresist film 21 is formed on one side.

As a result, the metallic plate 20 is completely etched off in the region where the photoresist film 21 is not formed, while leads 8 of a small plate thickness (100 to 125 µm or so) are formed in the region where the photoresist film 21 is formed on one side. Further, in the region where the photoresist film 21 is formed on both sides, the metallic plate 20 is not etched, so that there are formed connecting terminals 11 having the same plate thickness (200 to 250 µm or so) as that before etching. Thereafter, though not shown, bonding regions of the leads 8 (the regions for connection with the Au wires 9) are plated with Ag and the connecting terminals 11 are plated with Ni and Au, whereby the lead frame $LF_1$ shown in FIG. 5 is completed.

Figure 7:
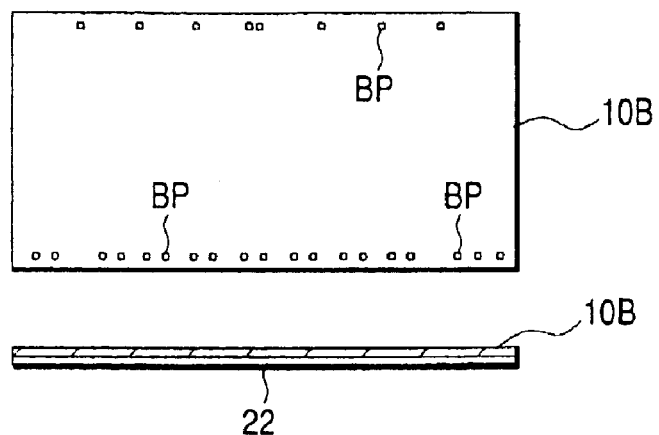
FIG. 7 illustrates a plane and a section of a control chip which is used in manufacturing the memory card of the first embodiment.
Figure 8:
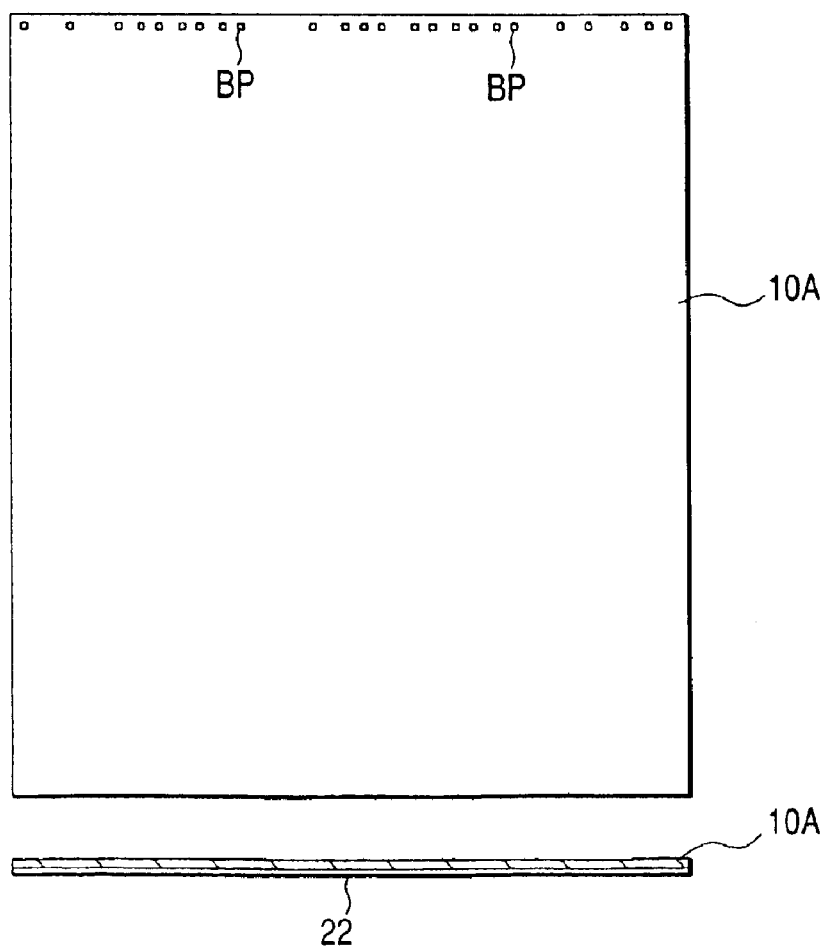
FIG. 8 illustrates a plane and a section of a memory chip used in manufacturing the memory card of the first embodiment.

For fabricating the memory card 1A with use of the lead frame $LF_1$, first there are provided such a control chip 10B as shown in FIG. 7 with a double coated adhesive tape 22 affixed to the back side thereof and such a memory chip 10A as shown in FIG. 8 with the double coated adhesive tape 22 affixed to the back side thereof.

Figure 9:
FIG. 9 is a side view illustrating how to affix a double coated adhesive tape to a back side of the control chip shown in FIG. 7.
Figure 10:
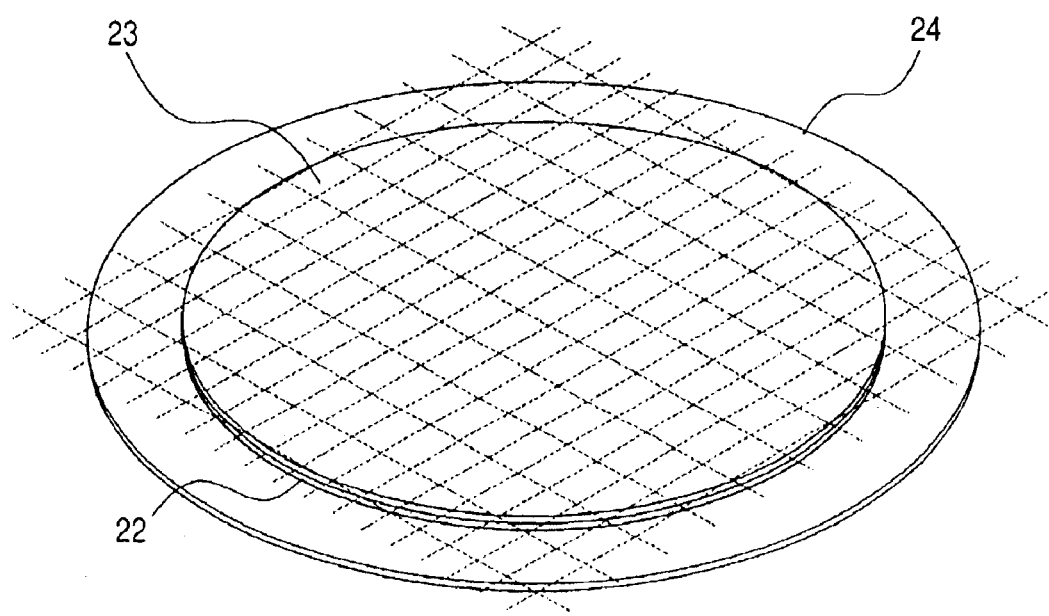
FIG. 10 is a perspective view thereof.

For example as shown in FIG. 9, the control chip 10B with the double coated adhesive tape affixed to the back side thereof is obtained by sandwiching the double coated adhesive tape 22 between a back side of a semiconductor wafer 23 with a control circuit formed thereon and a dicing tape 24 and by subsequently dicing the semiconductor wafer 23 and the double coated adhesive tape 22 simultaneously in this state. The memory chip 10A with the double coated adhesive tape 22 affixed to the back side thereof can also be obtained by the same method.

Figure 11:
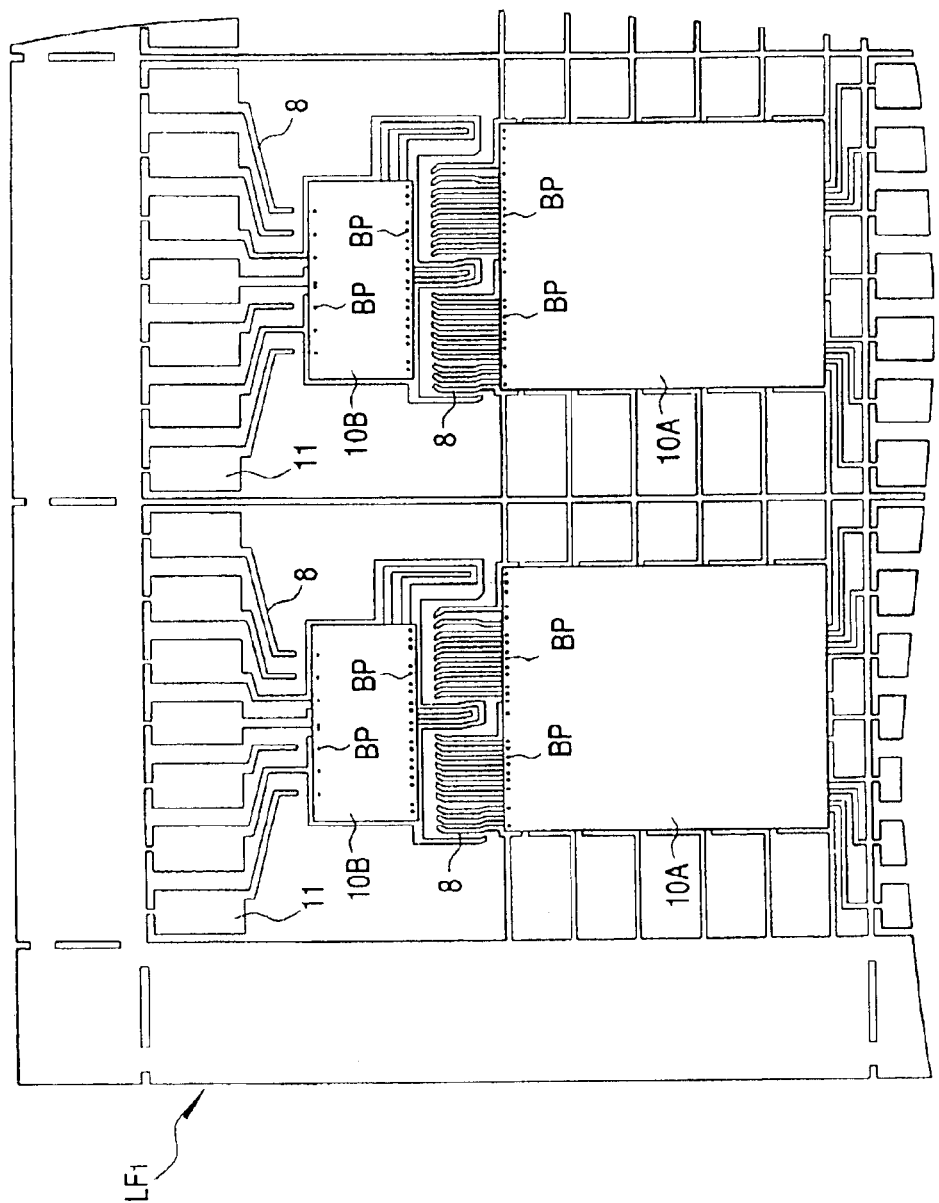
FIG. 11 is an enlarged plan view of a principal portion of the lead frame, showing how to manufacture the memory card of the first embodiment.
Figure 12:
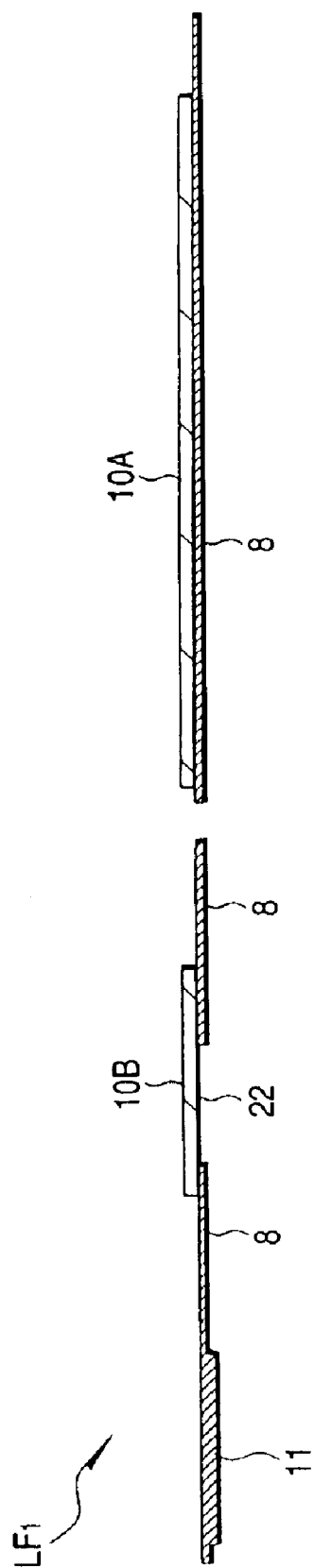
FIG. 12 is an enlarged sectional view of a principal portion of the lead frame, showing how to manufacture the memory card of the first embodiment.

Next, using the double coated adhesive tape 22, the memory chip 10A and the control chip 10B are bonded respectively to predetermined positions on the lead frame $LF_1$. FIG. 11 is an enlarged plan view showing a portion (a region corresponding to about two memory cards) of the lead frame $LF_1$ with memory chips 10A and control chips 10B bonded thereto and FIG. 12 is an enlarged sectional view showing a portion (a region corresponding to about one memory card) of the lead frame $LF_1$.

Figure 13:
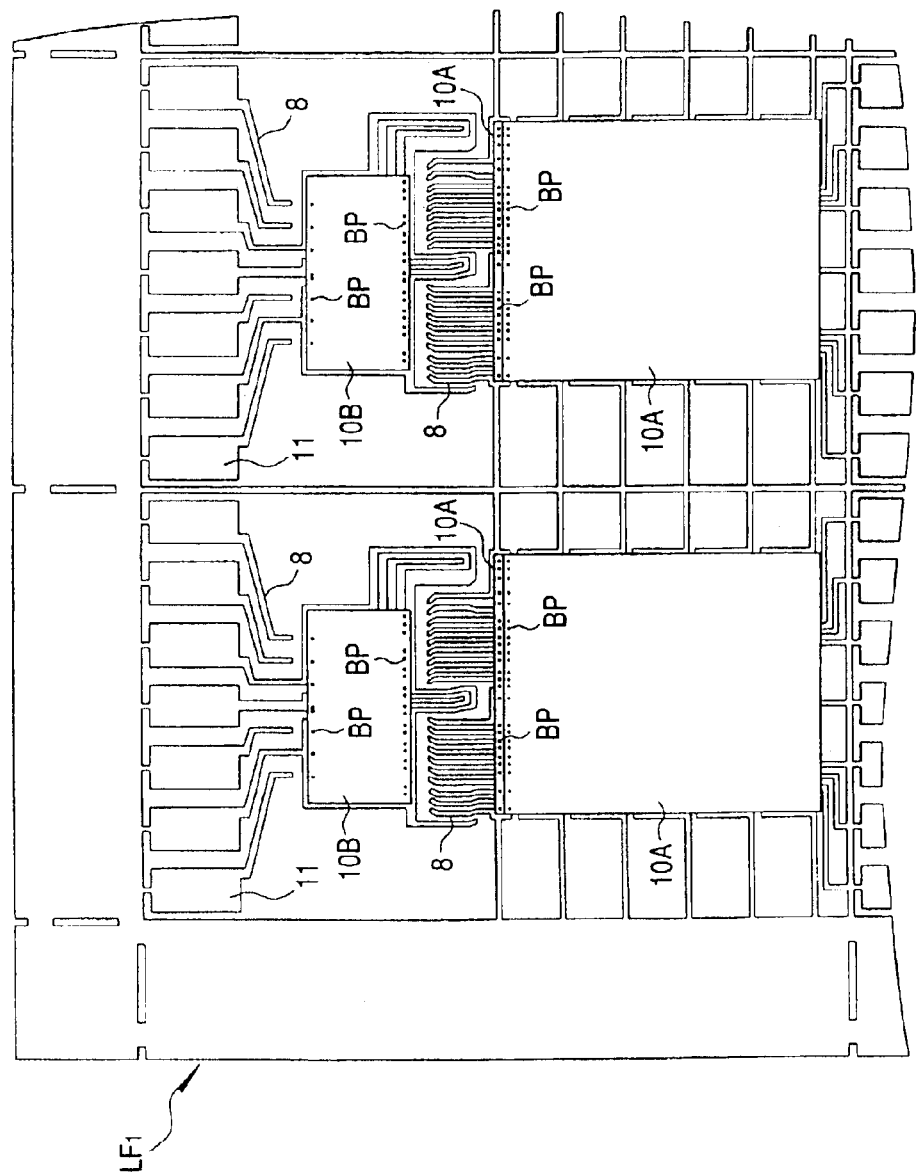
FIG. 13 is an enlarged plan view of a principal portion of the lead frame, showing how to manufacture the memory card of the first embodiment.
Figure 14:
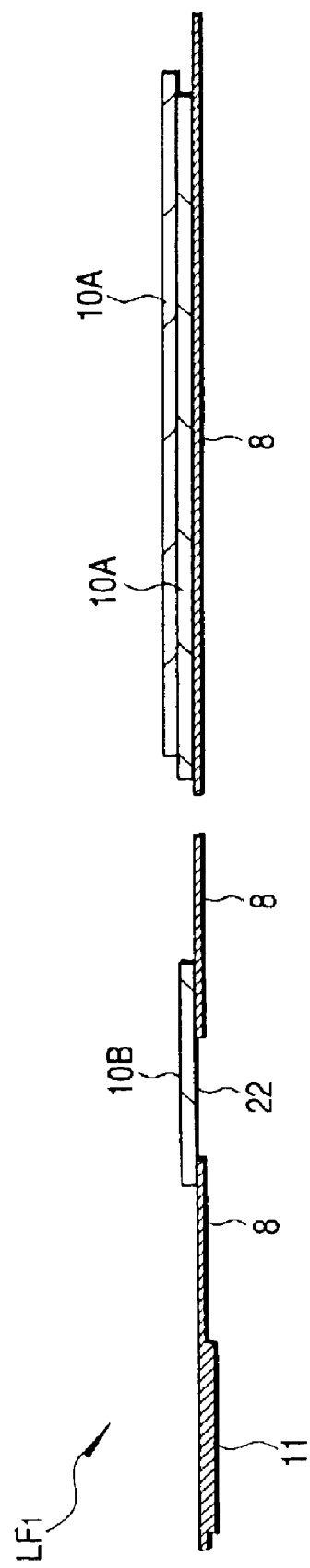
FIG. 14 is an enlarged sectional view of a principal portion of the lead frame, showing how to manufacture the memory card of the first embodiment.

Then, as shown in FIGS. 13 and 14, a second memory chip 10A is bonded onto the memory chip 10A with use of the double coated adhesive tape 22. At this time, the second memory chip 10A is stacked on the underlying memory chip 10A while both memory chips are displaced from each other to avoid overlapping of the bonding pads BP of the underlying memory chip 10A with the overlying memory chip 10A.

Figure 15:
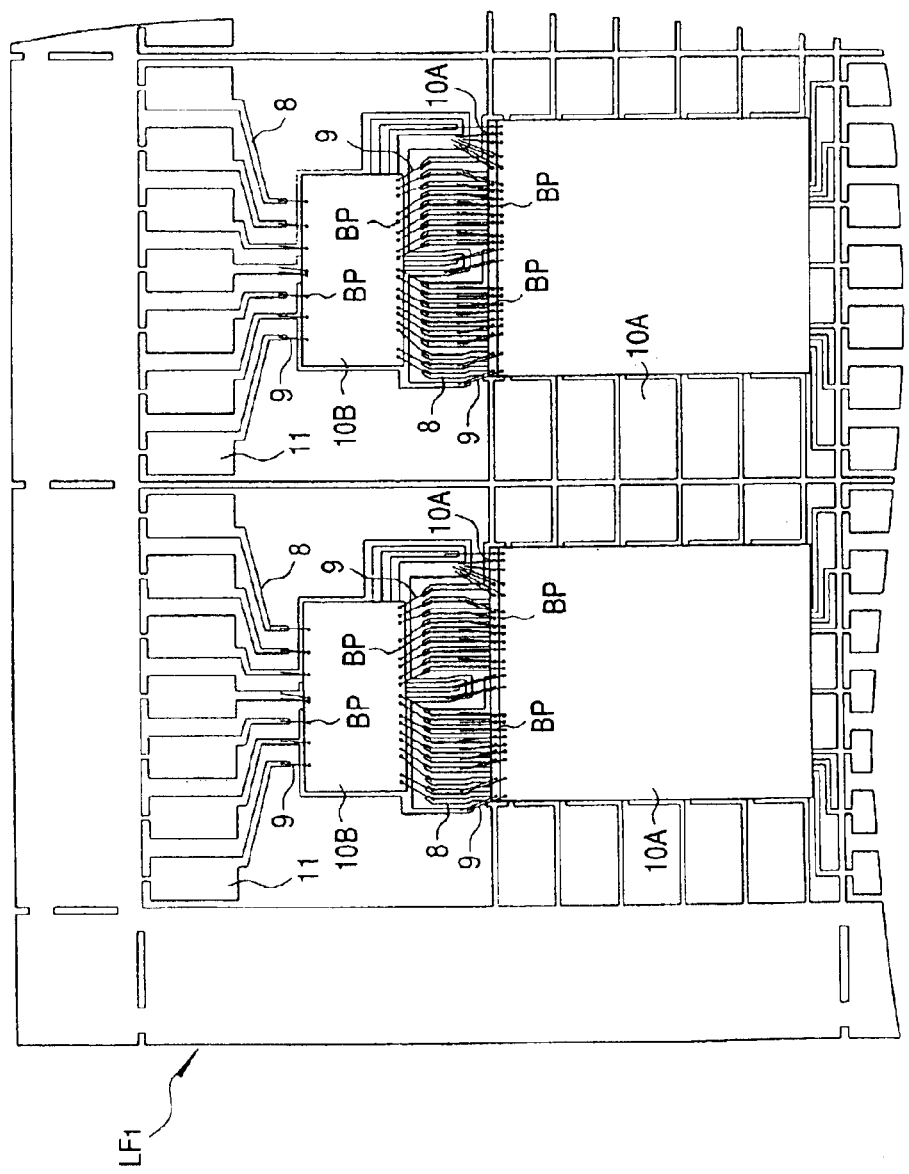
FIG. 15 is an enlarged plan view of a principal portion of the lead frame, showing how to manufacture the memory card of the first embodiment.
Figure 16:
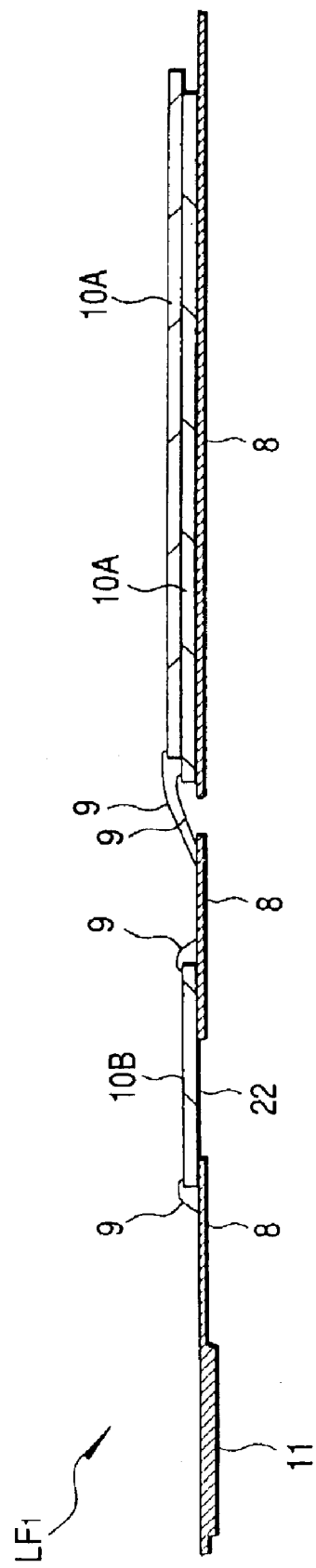
FIG. 16 is an enlarged sectional view of a principal portion of the lead frame, showing how to manufacture the memory card of the first embodiment.

Next, as shown in FIGS. 15 and 16, bonding pads BP of the memory chips 10A and bonding pads BP of the control chip 10B are respectively connected to leads 8 through Au wires 9 by means of a known ball bonder (not shown).

Figure 17:
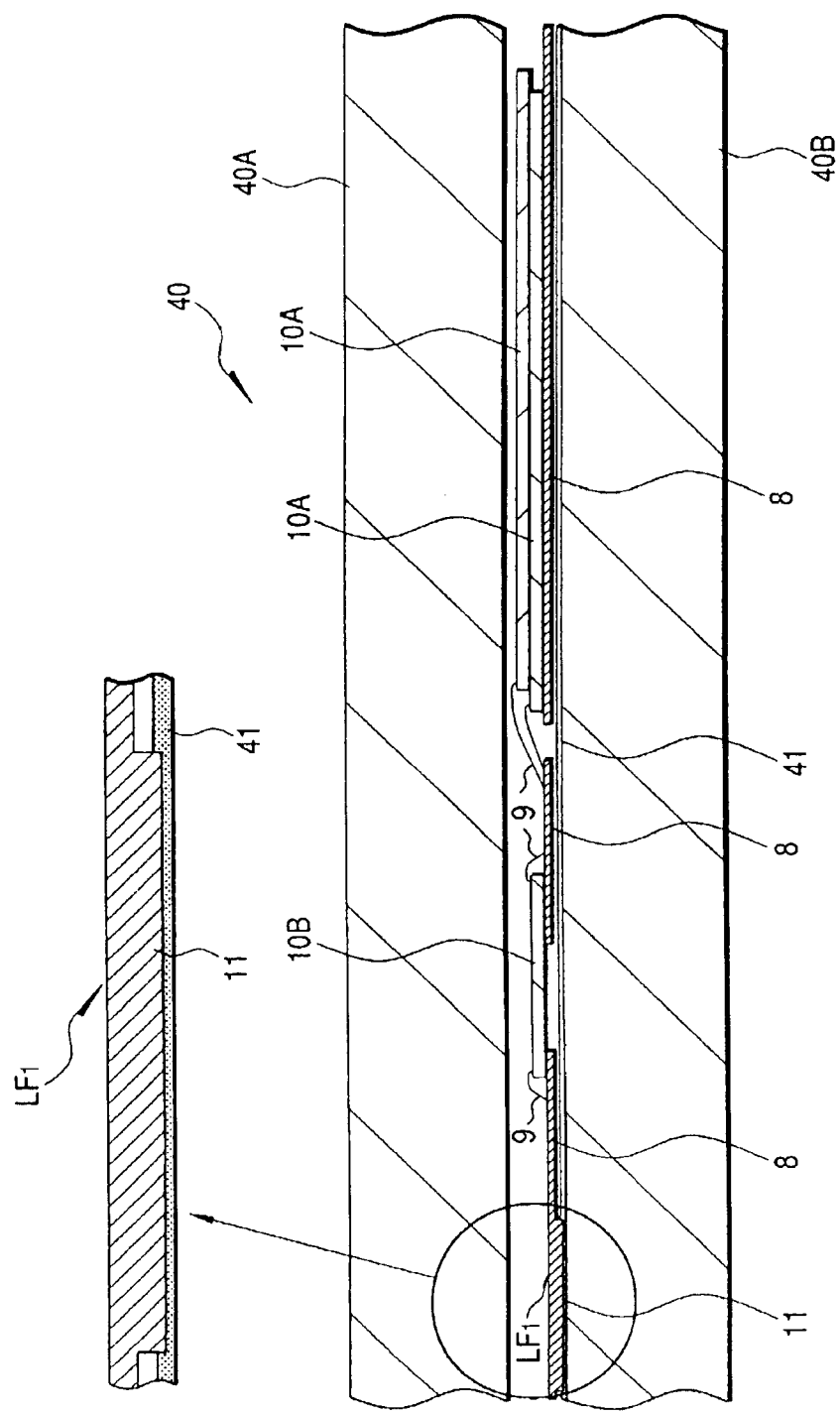
FIG. 17 is an enlarged sectional view of a principal portion of a molding die, showing how to manufacture the memory card of the first embodiment.

Then, using a molding die, the lead frame $LF_1$ and the semiconductor chips (two memory chips 10A and a control chip 10B) are sealed with resin. FIG. 17 is an enlarged sectional view showing a portion (a region corresponding to about one memory card) of a molding die 40.

For sealing the lead frame $LF_1$ and the semiconductor chips (two memory chips 10A and a control chip 10B)) using the molding die 40, first a thin resin sheet 41 is placed on a surface of a lower mold 40B of the molding die 40 and thereafter the lead frame $LF_1$ is placed on the resin sheet 41. In this case, the lead frame $LF_1$ is placed with the side thereof facing down on which side are formed the connecting terminals 11, allowing the connecting terminals 11 to come into contact with the resin sheet 41. In this state the resin sheet 41 and the lead frame $LF_1$ are pinched by both upper mold 40A and lower mold 40B. By so doing, the connecting terminals 11 are pushed against the resin sheet 41 with an urging force of the molding die 40 (upper mold 40A and lower mold 40B), so that their tip portions bite into the resin sheet 41.

Figure 18:
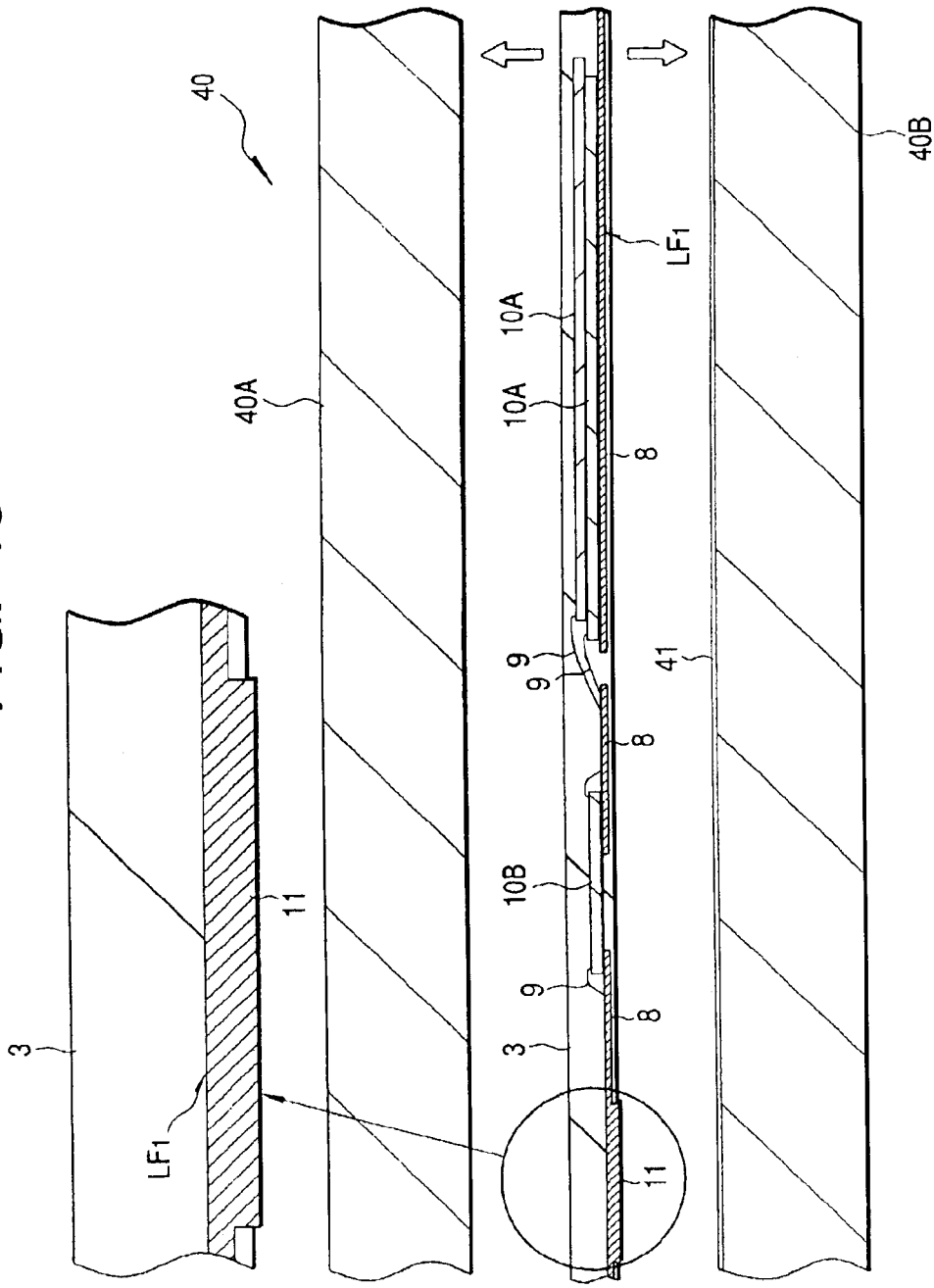
FIG. 18 is an enlarged sectional view of the principal portion of the molding die, showing how to manufacture the memory card of the first embodiment.
Figure 19:
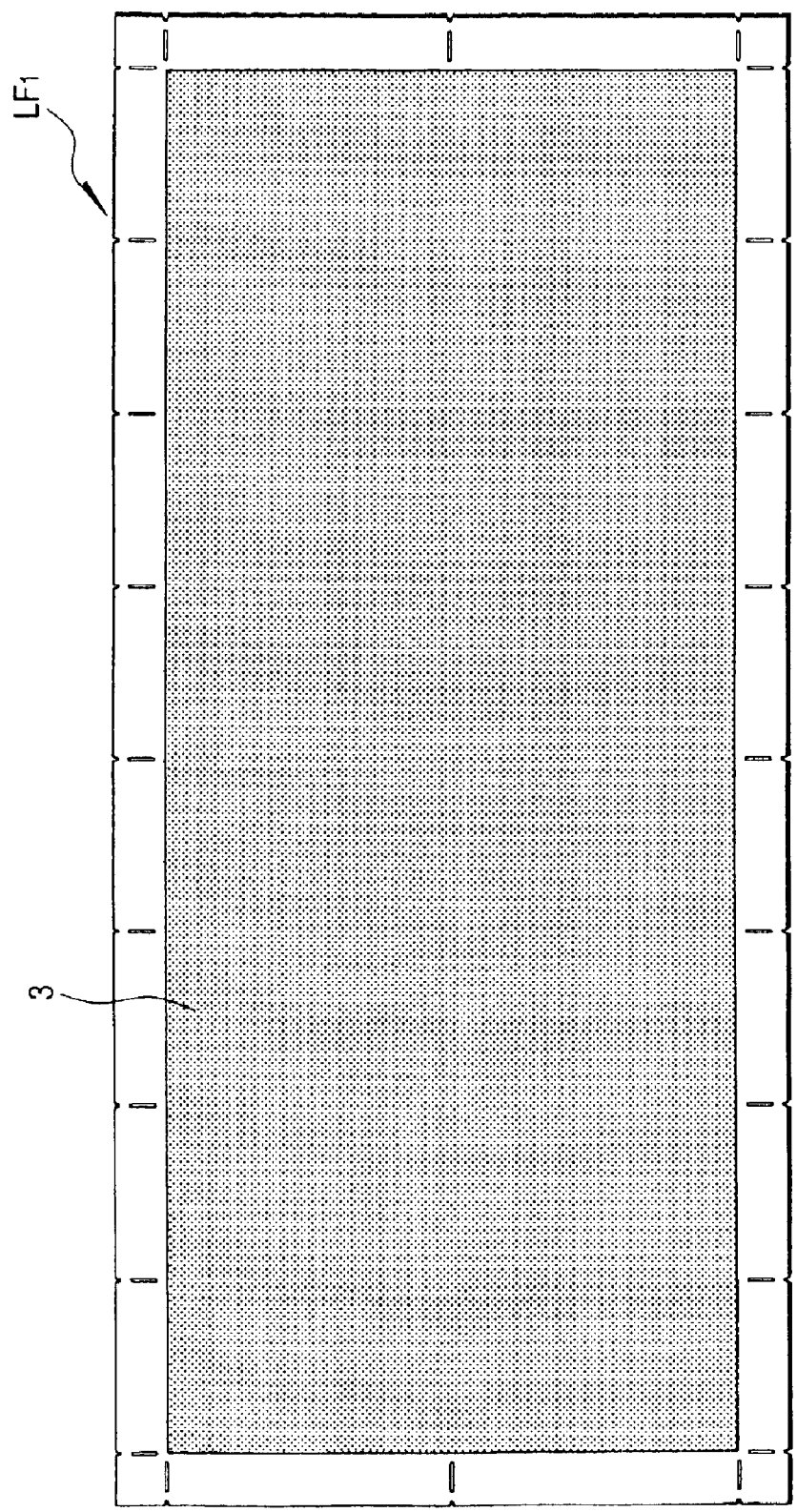
FIG. 19 is a plan view (surface side) of the whole of the lead frame after a molding process, showing how to manufacture the memory card of the first embodiment.
Figure 20:
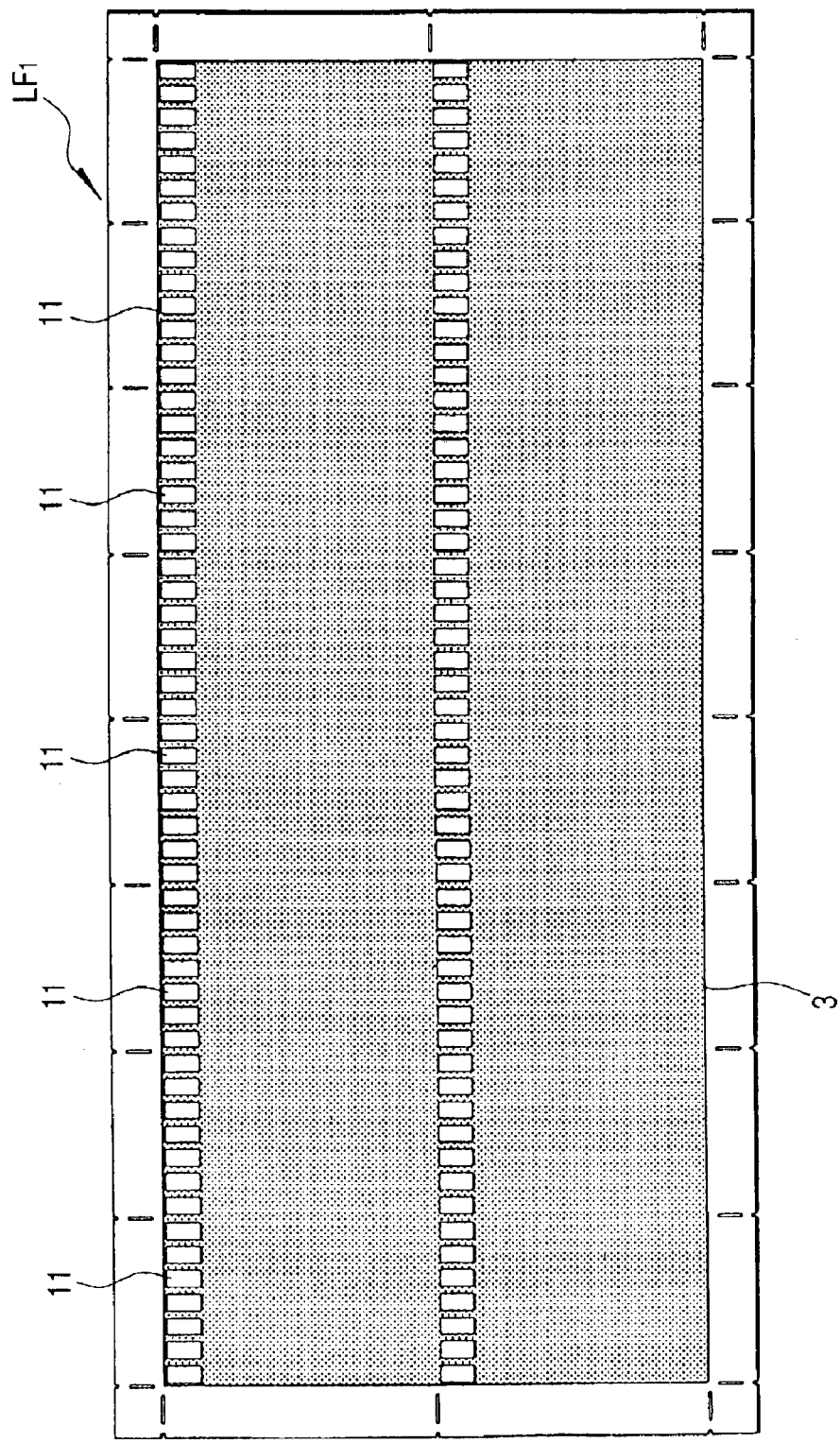
FIG. 20 is a plan view (back side) thereof.

As a result, as shown in FIG. 18, when the upper mold 40A and the lower mold 40B are separated from each other after the injection of molten resin into a cavity formed between both molds 40A and 40B, only the tip portions of the connecting terminals 11 that have bitten into the resin sheet 41 is exposed to the exterior from the back side of the sealing member 3. FIG. 19 is a plan view of a surface side of the lead frame $LF_1$ removed from the molding die 40 and FIG. 20 is a plan view of a back side thereof.

Next, the lead frame $LF_1$ and the resin are diced using a diamond blade or the like, whereby there are obtained such plural (sixteen) individually diced sealing members 3 as shown in FIG. 21. Thereafter, as shown in FIG. 22, a surface of the sealing member 3 is bonded to the back side of the cap 2 with use of a double coated adhesive tape 25 or the like, whereby the memory card 1A of this embodiment shown in FIGS. 1 to 4 is completed.

According to the memory card 1A of this embodiment, since both upper and lower sides of the semiconductor chips (two memory chips 10A and a control chip 10B) are covered with the sealing member 3, it is possible to prevent or suppress warping of the sealing member.

Besides, since the difference in thermal expansion coefficient between the lead frame $LF_1$ (thermal expansion coefficient=$4.4 \times 10^{-6}/°$ C. to $17 \times 10^{-6}/°$ C. or so) and the insulating resin (thermal expansion coefficient=$9 \times 10^{-6}/°$ C. to $16 \times 10^{-6}/°$ C. or so) is smaller than that between the multi-layer wiring substrate (thermal expansion coefficient of a glass fabric-based epoxy resin board=$1.3 \times 10^{-5}/°$ C. to $1.6 \times 10^{-6}/°$ C. or so) and the insulating resin, it is possible to prevent or suppress the occurrence of warping of the sealing member.

Consequently, it is possible to diminish an appearance defect rate of the memory card 1A and hence possible to improve the memory card manufacturing yield.

Moreover, since the multi-layer wiring substrate used in the conventional memory card is substituted by the lead frame $LF_1$ whose manufacturing cost is lower than that of the former, it is possible to decrease the memory card manufacturing cost.

(Second Embodiment)

Figure 23:
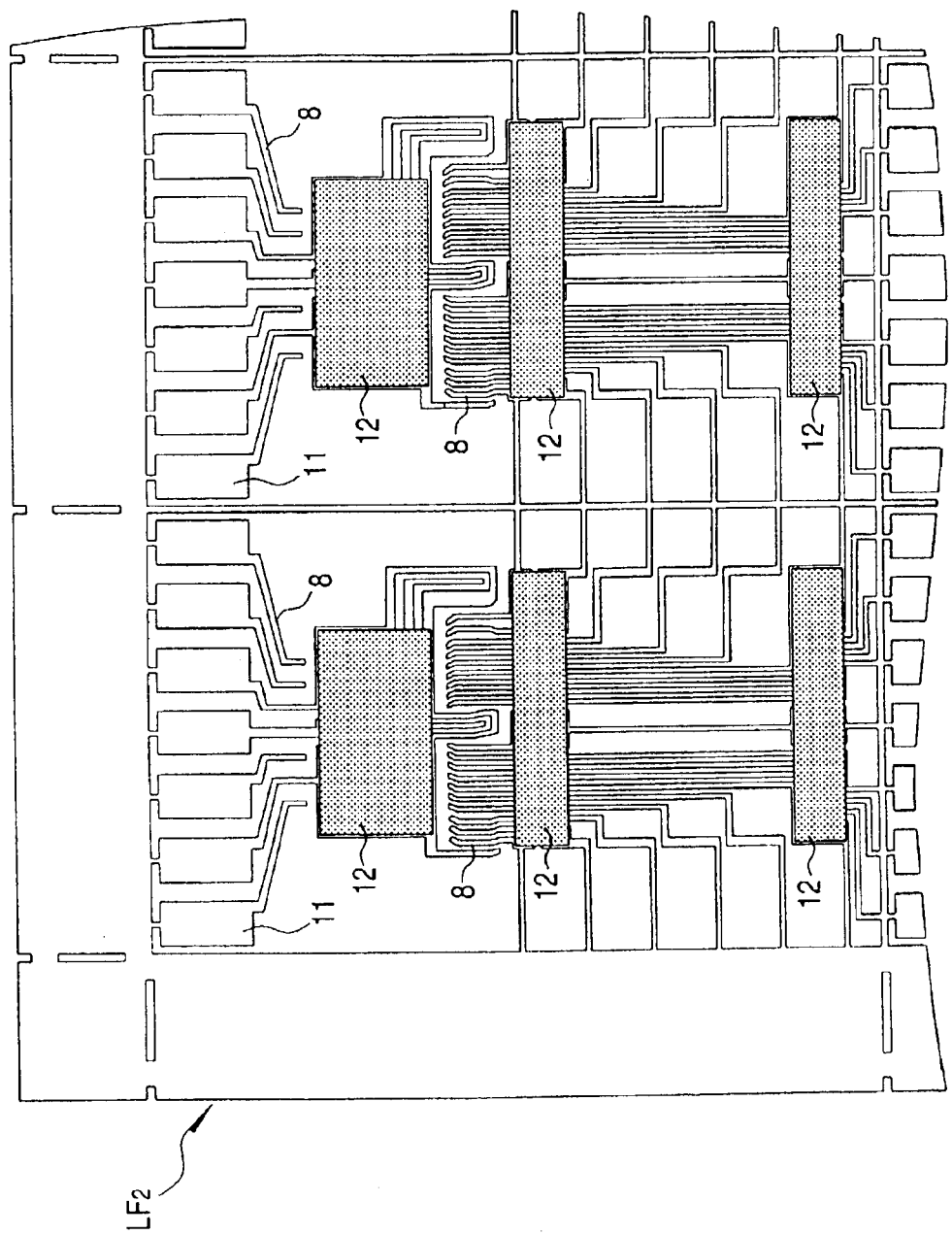
FIG. 23 is an enlarged plan view of a principal portion of a lead frame used in manufacturing a memory card according to a second embodiment of the present invention.
Figure 24:
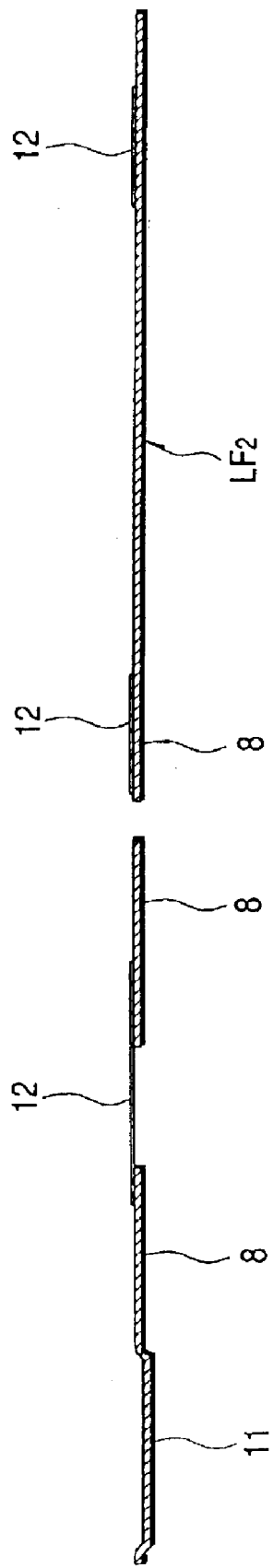
FIG. 24 is an enlarged sectional view of a principal portion of the lead frame used in manufacturing the memory card of the second embodiment.

FIG. 23 is an enlarged plan view showing a portion (a region corresponding to about two memory cards) of a lead frame $LF_2$ used in this second embodiment and FIG. 24 is a sectional view showing a portion (a region corresponding to about one memory card) of the lead frame $LF_2$.

The lead frame $LF_2$ is of a construction wherein an insulating tape 12 is bonded to a region where semiconductor chips (two memory chips 10A and a control chip 10B) are mounted. Connecting terminals 11 are formed by bending a portion of the lead frame LF2 with a press.

Figure 25:
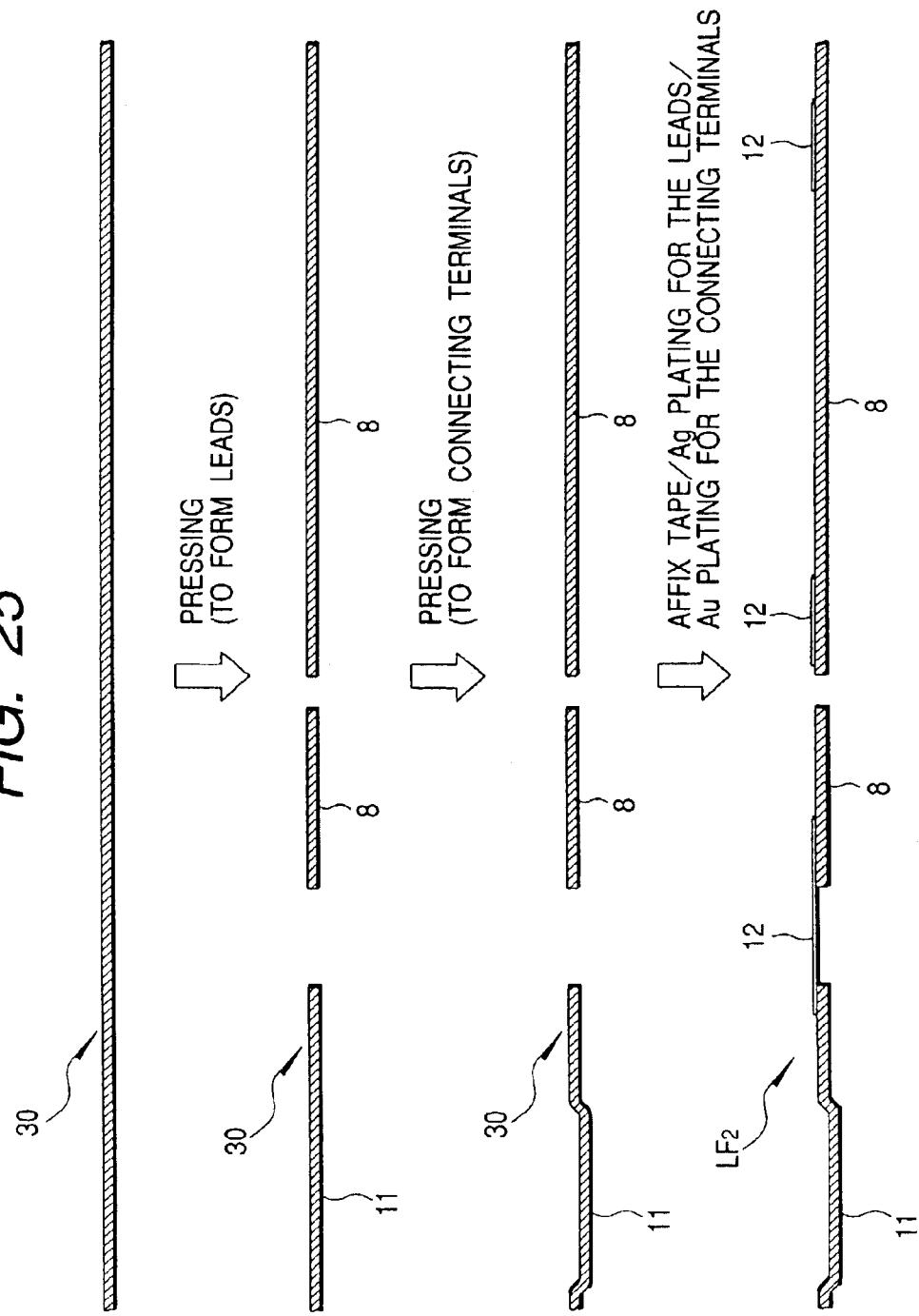
FIG. 25 is a sectional view illustrating how to fabricate the lead frame shown in FIG. 24.

For fabricating the lead frame $LF_2$, as shown in FIG. 25, a metallic plate 30 is punched with a press to form leads 8 and connecting terminals 11 and thereafter the connecting terminals 11 are bent downward with the press. Alternatively, a photoresist film is formed on one side of the metallic plate 30 in a region where leads 8 and connecting terminals 11 are to be formed, then in this state the metallic plate 30 is subjected to half-etching to form leads 8 and connecting terminals 11, and thereafter the connecting terminals 11 are bent downward with the press. Subsequently, the insulating tape 12 is bonded to the mounting region of the semiconductor chips (two memory chips 10A and a control chip 10B), whereby the lead frame $LF_2$ is completed.

Figure 26:
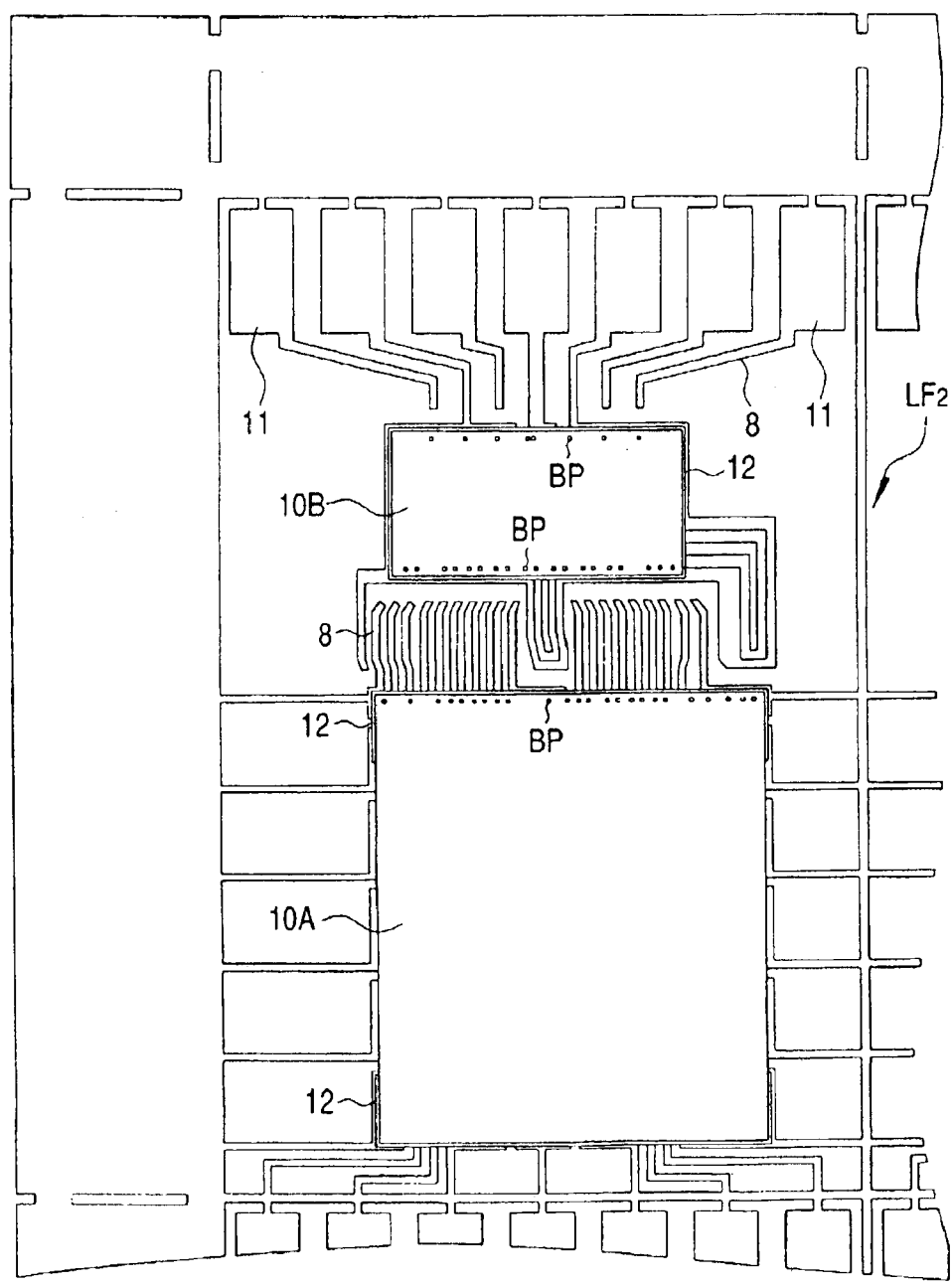
FIG. 26 is an enlarged plan view of a principal portion of the lead frame, showing how to manufacture the memory card of the second embodiment.
Figure 27:
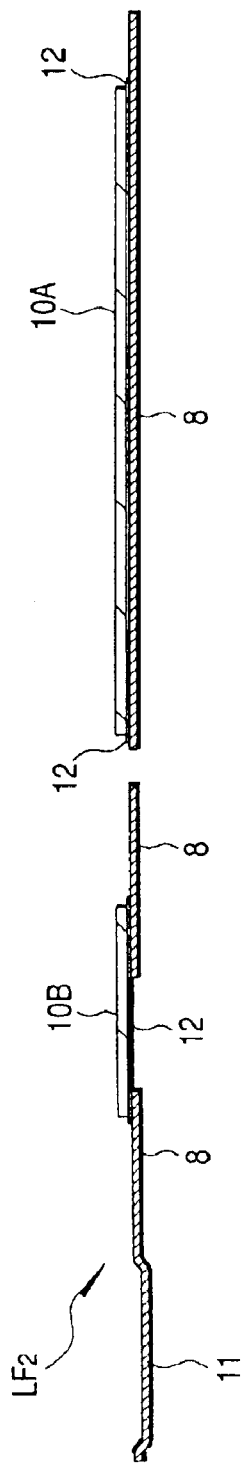
FIG. 27 is an enlarged sectional view thereof.

FIG. 26 is an enlarged plan view showing a mounted state of a memory chip 10A and a control chip 10B on the lead frame $LF_2$ and FIG. 27 is a sectional view thereof. A memory chip 10A and a control chip 10B can be mounted onto the lead frame $LF_2$ for example by applying an adhesive (not shown) to a surface of the insulating tape 12 and subsequently bonding a memory chip 10A and a control chip 10B to the surface of the insulating tape 12.

In case of using the lead frame $LF_2$ having the insulating tape 12 described above, it is possible to omit the work of affixing the double coated adhesive tape 22 to back sides of the memory chip 10A and the control chip 10B as in the first embodiment.

Figure 28:
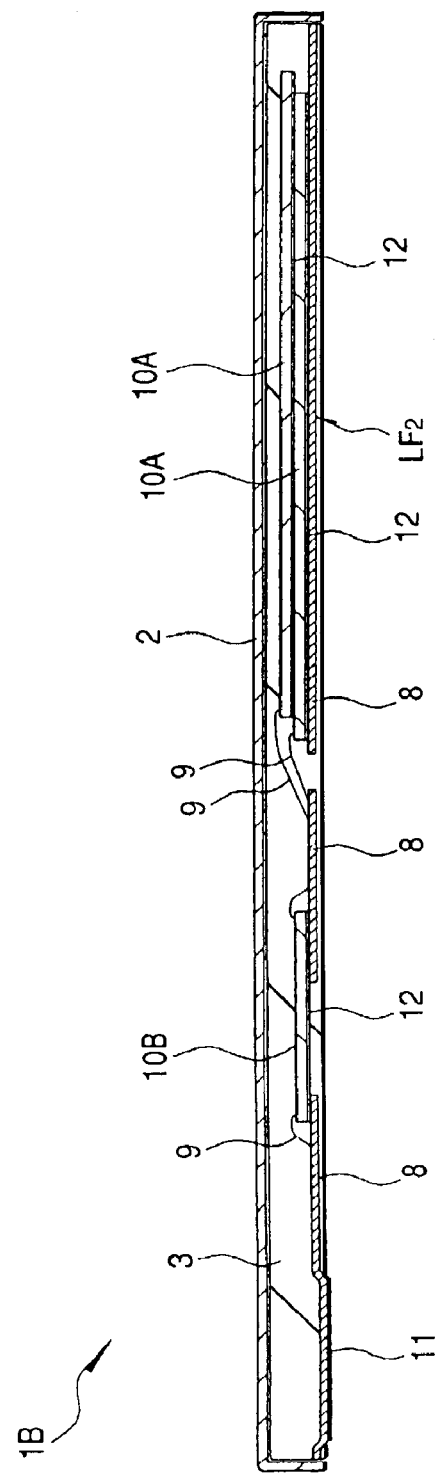
FIG. 28 is a sectional view of the memory card of the second embodiment.

Thereafter, wire bonding, resin sealing, and dicing are carried out in the same way as in the first embodiment to afford such a memory card 1B of this second embodiment as shown in FIG. 28.

(Third Embodiment)

Figure 29:
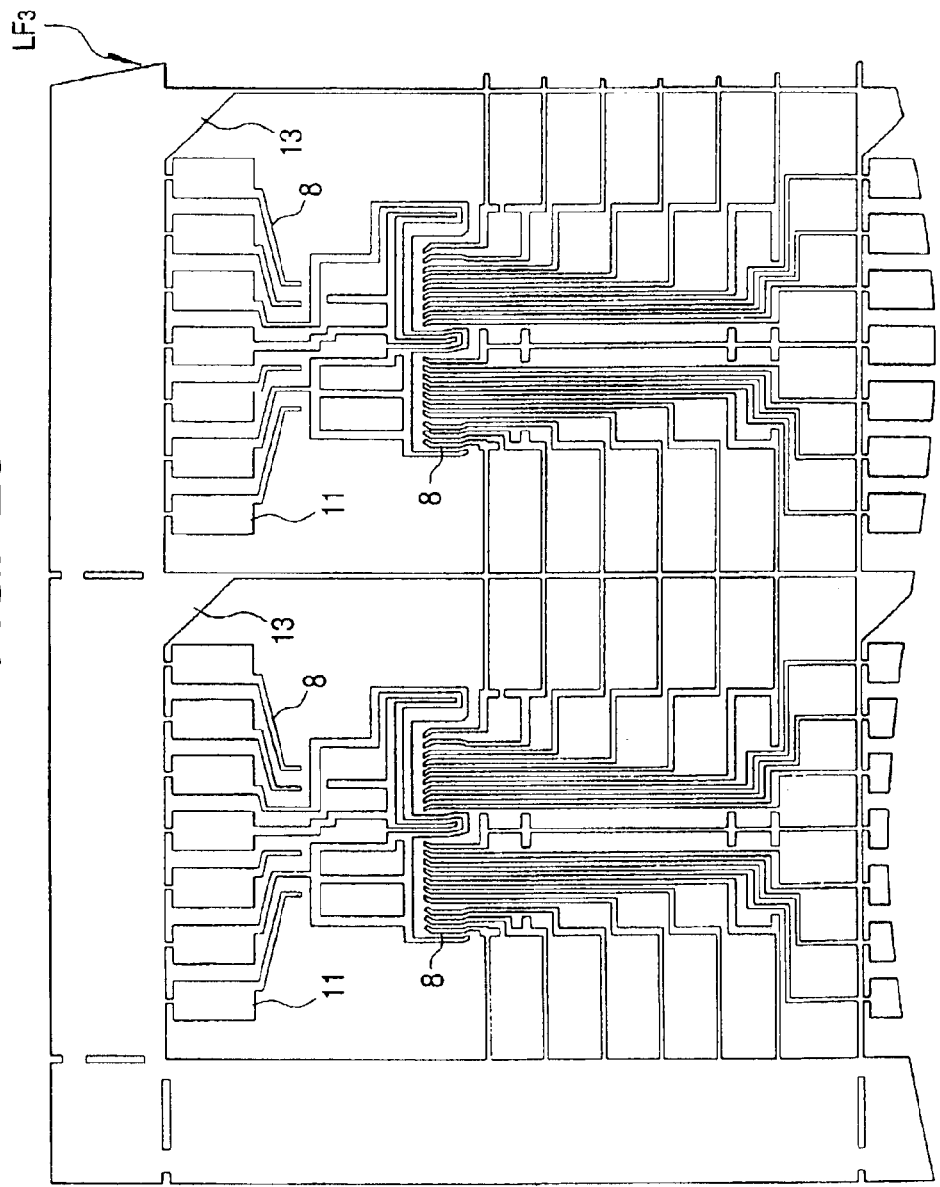
FIG. 29 is an enlarged plan view of a principal portion of a lead frame used in manufacturing a memory card according to a third embodiment of the present invention.

FIG. 29 is an enlarged plan view showing a portion (a region corresponding to about two memory cards) of a lead frame LF3 used in this third embodiment.

In the lead frame $LF_3$, a triangular corner dam 13 provided at a position corresponding to one corner of a sealing member 3 so that an oblique cutout portion is formed is formed at one corner of the sealing member 3 when semiconductor chips (two memory chips 10A and a control chip 10B) are sealed with resin to form the sealing member 3.

The method of mounting semiconductor chips (two memory chips 10A and a control chip 10B) onto the lead frame $LF_3$ and subsequent wire bonding is the same as in the first embodiment.

Figure 30:
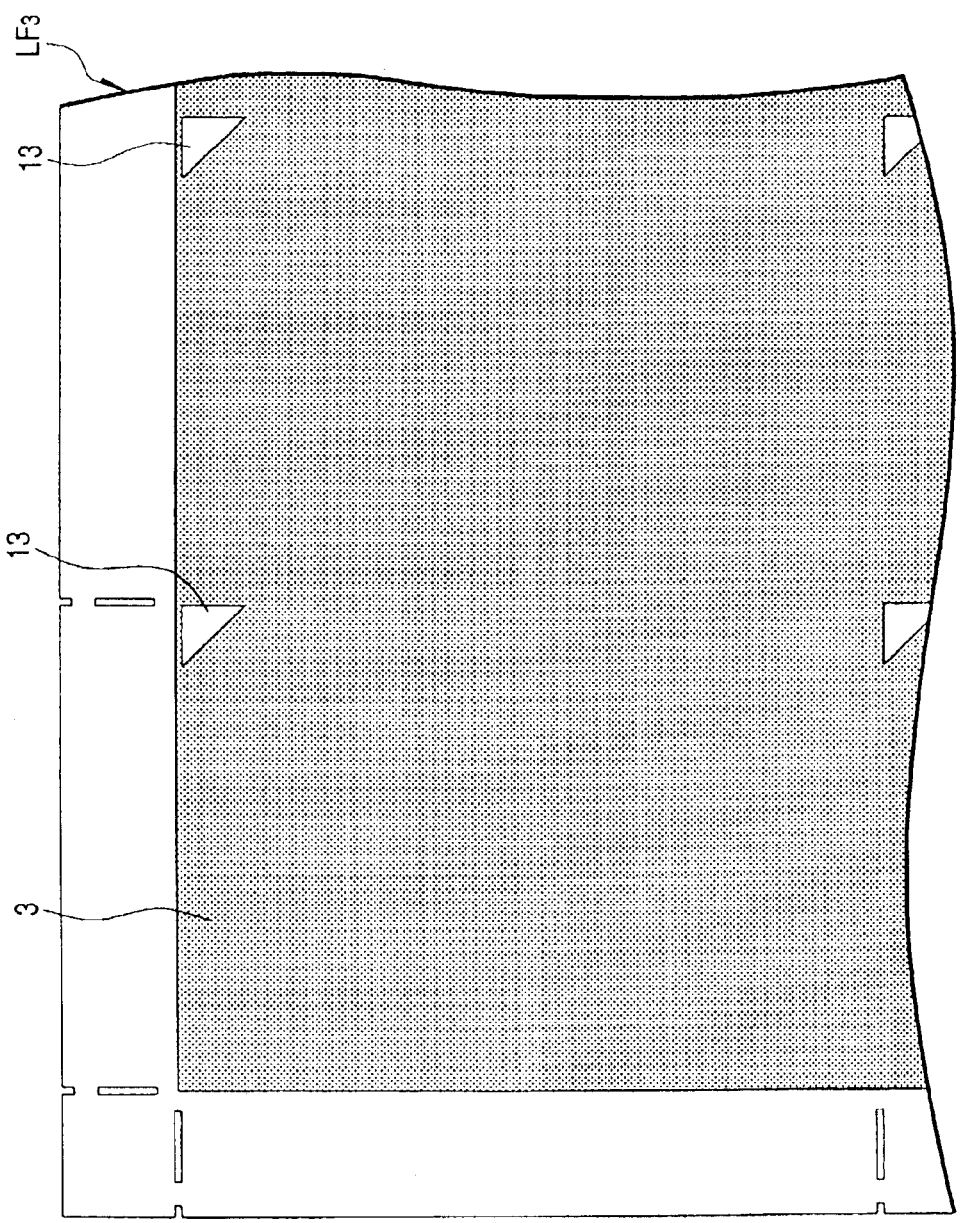
FIG. 30 is an enlarged plan view (surface side) of a principal portion of the lead frame, showing how to manufacture the memory card of the third embodiment.
Figure 31:
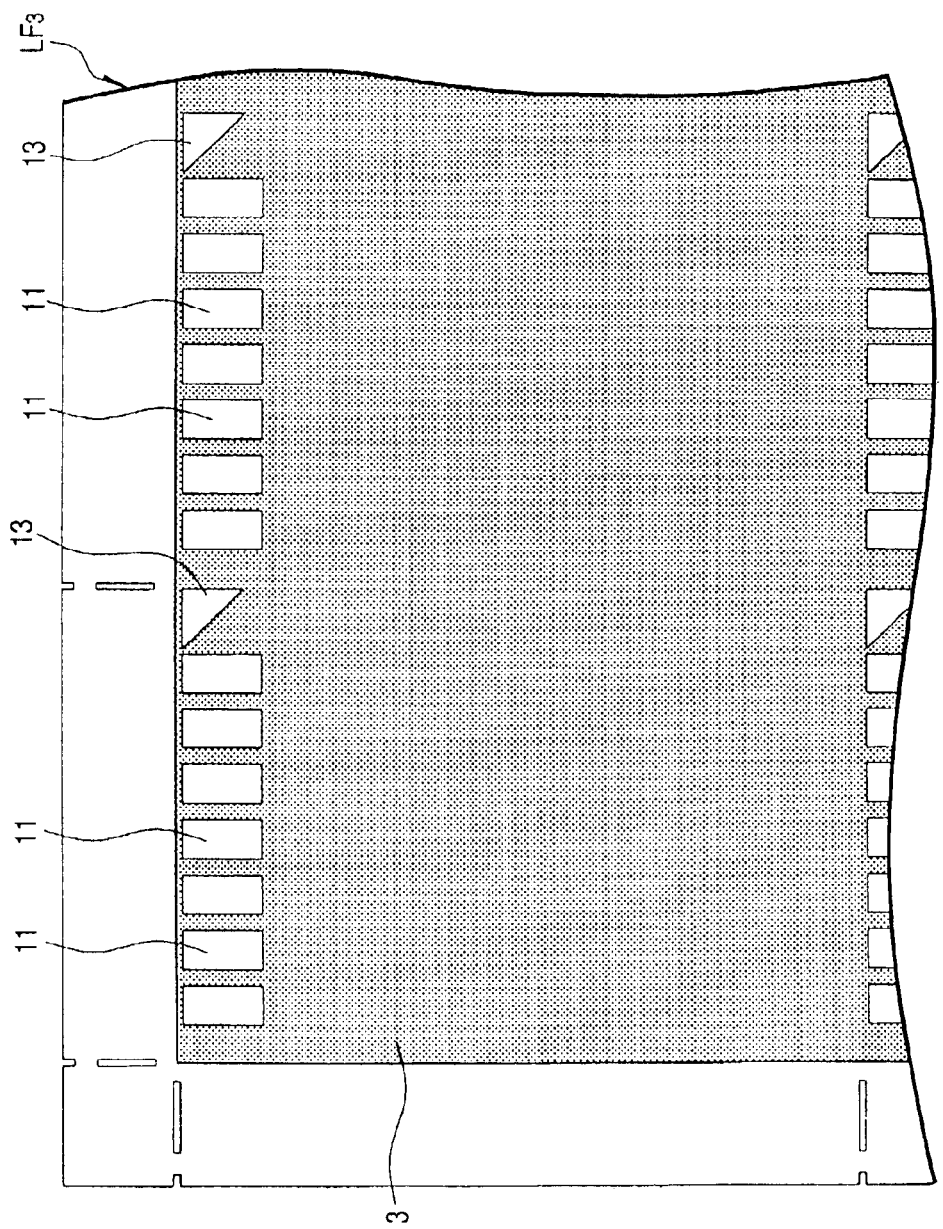
FIG. 31 is an enlarged plan view (back side) thereof.

FIG. 30 is an enlarged plan view (surface side) showing a state in which the semiconductor chips (two memory chips 10A and a control chip 10B) mounted on the lead frame $LF_3$ have been sealed with resin to form the sealing member 3, and FIG. 31 is an enlarged plan view (back side) thereof. In forming the sealing member 3 by molding, as shown in the figures, eject pins are arranged at positions corresponding to corner dams 13 in a molding die (an upper mold and a lower mold) so that the corner dams 13 are exposed to the exterior of the sealing member 3.

Figure 32:
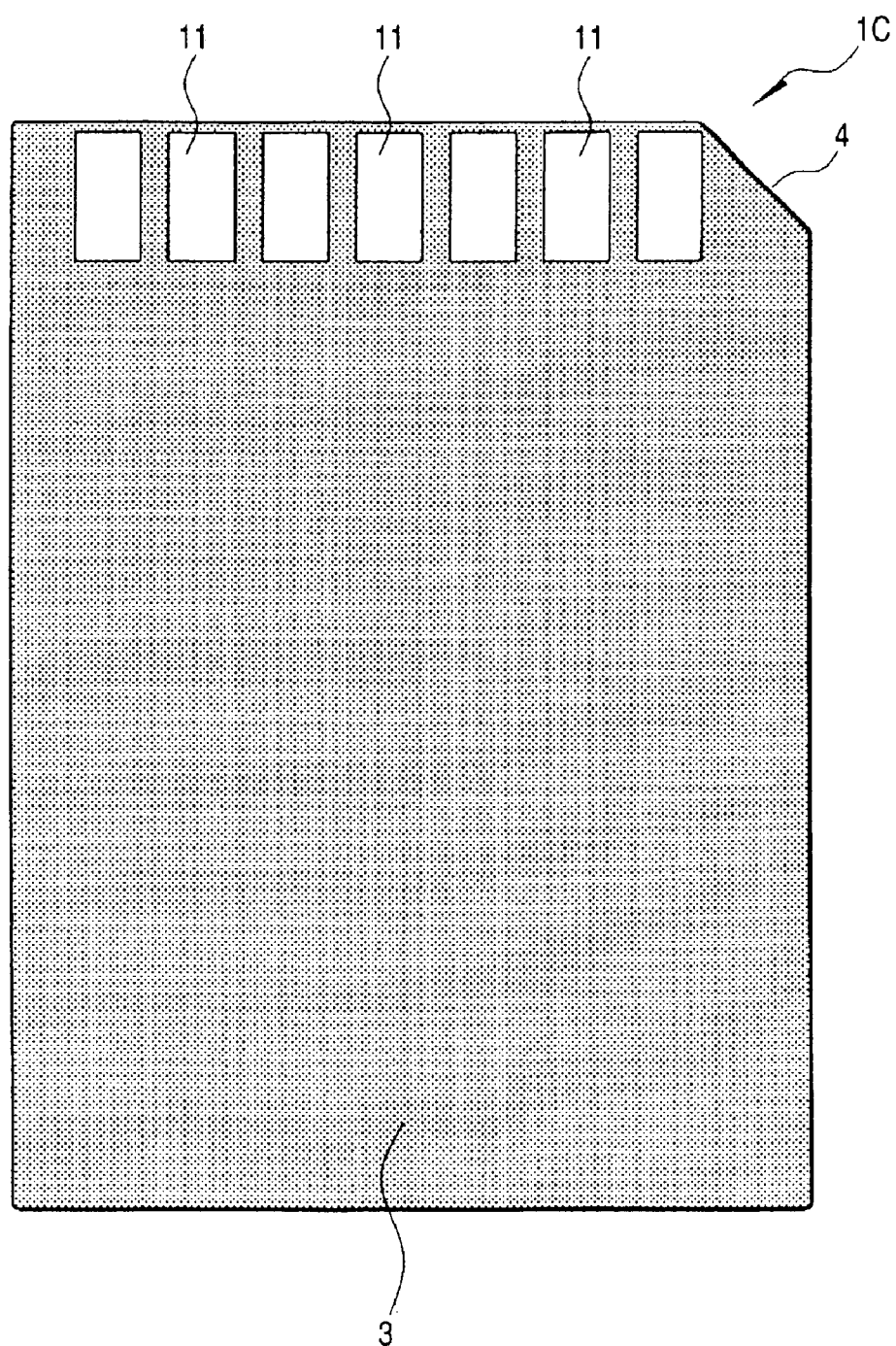
FIG. 32 is a plan view (back side) of the memory card of the third embodiment.

Thereafter, the lead frame $LF_3$ and the resin are subjected to dicing with use of a diamond blade or the like, whereby a sealing member 3 as an individual piece is obtained, as shown in FIG. 32.

The sealing member 3 shown in FIG. 32 can be used as it is as a memory card IC without being covered its surface with a cap. Specification of the memory card IC and an index mark can be printed directly to a surface of the sealing member 3 with use of a laser marker for example.

As a result, it is possible to reduce the number of parts and the number of assembling steps and hence possible to provide a less expensive memory card IC.

Figure 33:
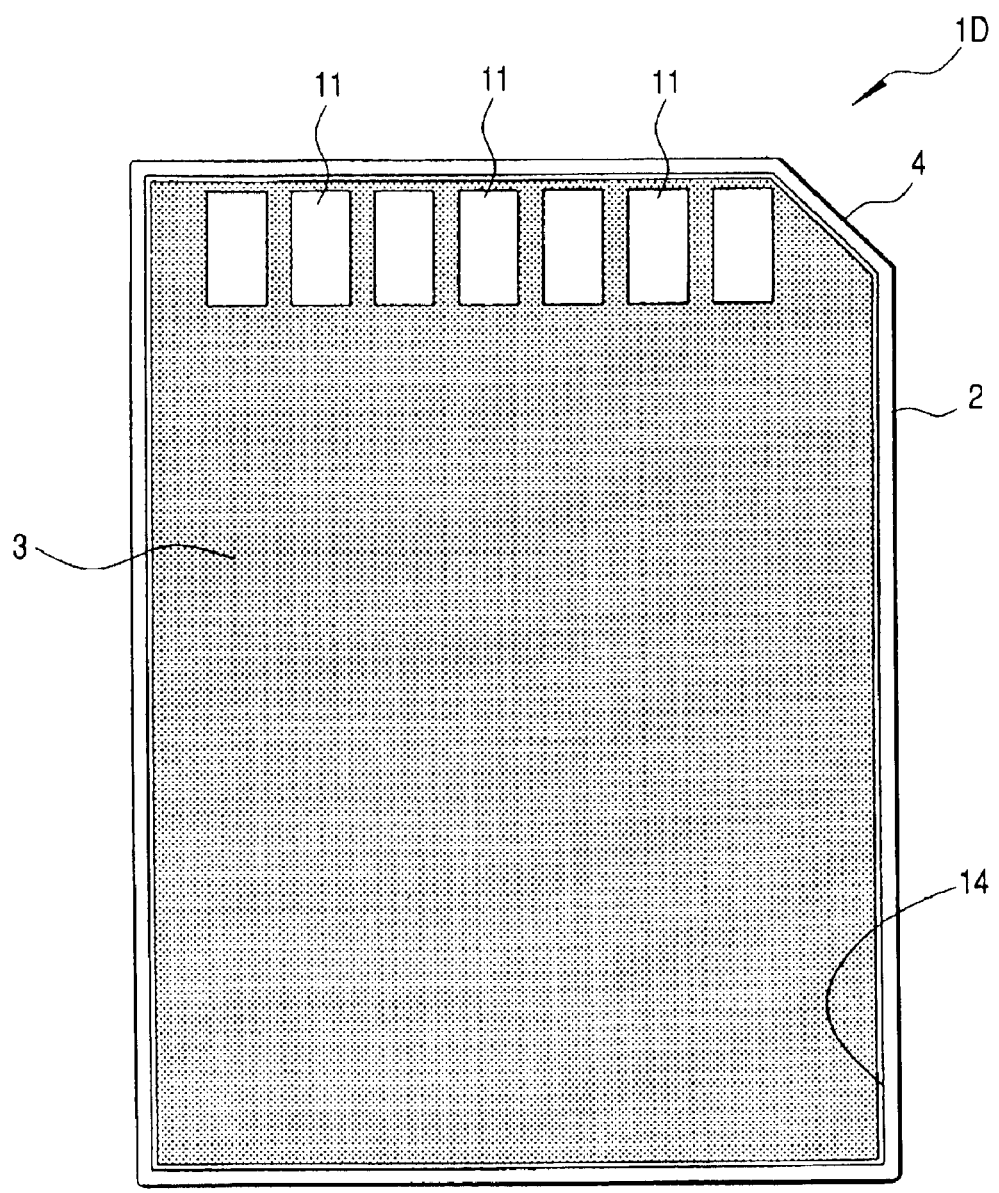
FIG. 33 is a plan view (back side) of the memory card of the third embodiment.

In case of covering the sealing member 3 shown in FIG. 32 with a cap, as shown in FIG. 33, a groove 14 of a shape similar to the shape of the sealing member 3 may be formed in a back side of the cap 2 and the sealing member 3 may be fitted in the groove 14. By so doing, even in the case where the cap 2 just referred to above has the same outside diameter as that of the cap 2 used in the first embodiment, the volume of the sealing member 3 fitted in the groove 14 can be made larger. As a result, the chip mounting area in the sealing member 3 becomes larger and hence it is possible to mount a memory chip 10A of a large outside diameter, i.e., a large memory capacity, thus permitting the provision of a memory card ID of a large capacity.

(Fourth Embodiment)

Although in the first embodiment the semiconductor chips (two memory chips 10A and a control chip 10B) are sealed with resin using a molding die (see FIGS. 17 and 18) having a structure of molding the whole of the lead frame ($LF_1$) of a multi-frame structure at a time, the semiconductor chips (two memory chips 10A and a control chip 10B) may be sealed with resin using a molding die having cavities which permit sealing members 3 to be formed individually product area by product area.

Figure 34:
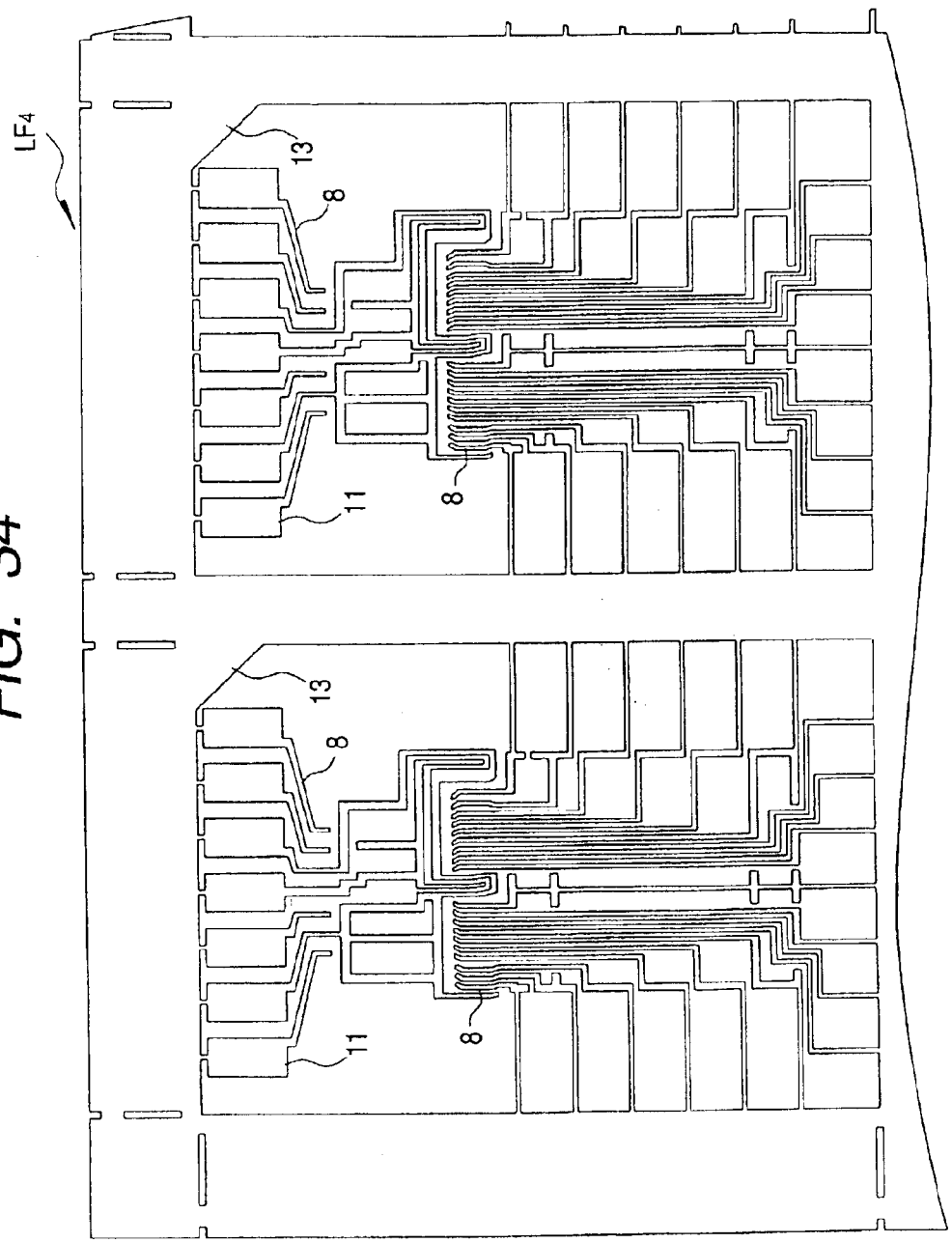
FIG. 34 is an enlarged plan view of a principal portion of a lead frame used in manufacturing a memory card according to a fourth embodiment of the present invention.
Figure 35:
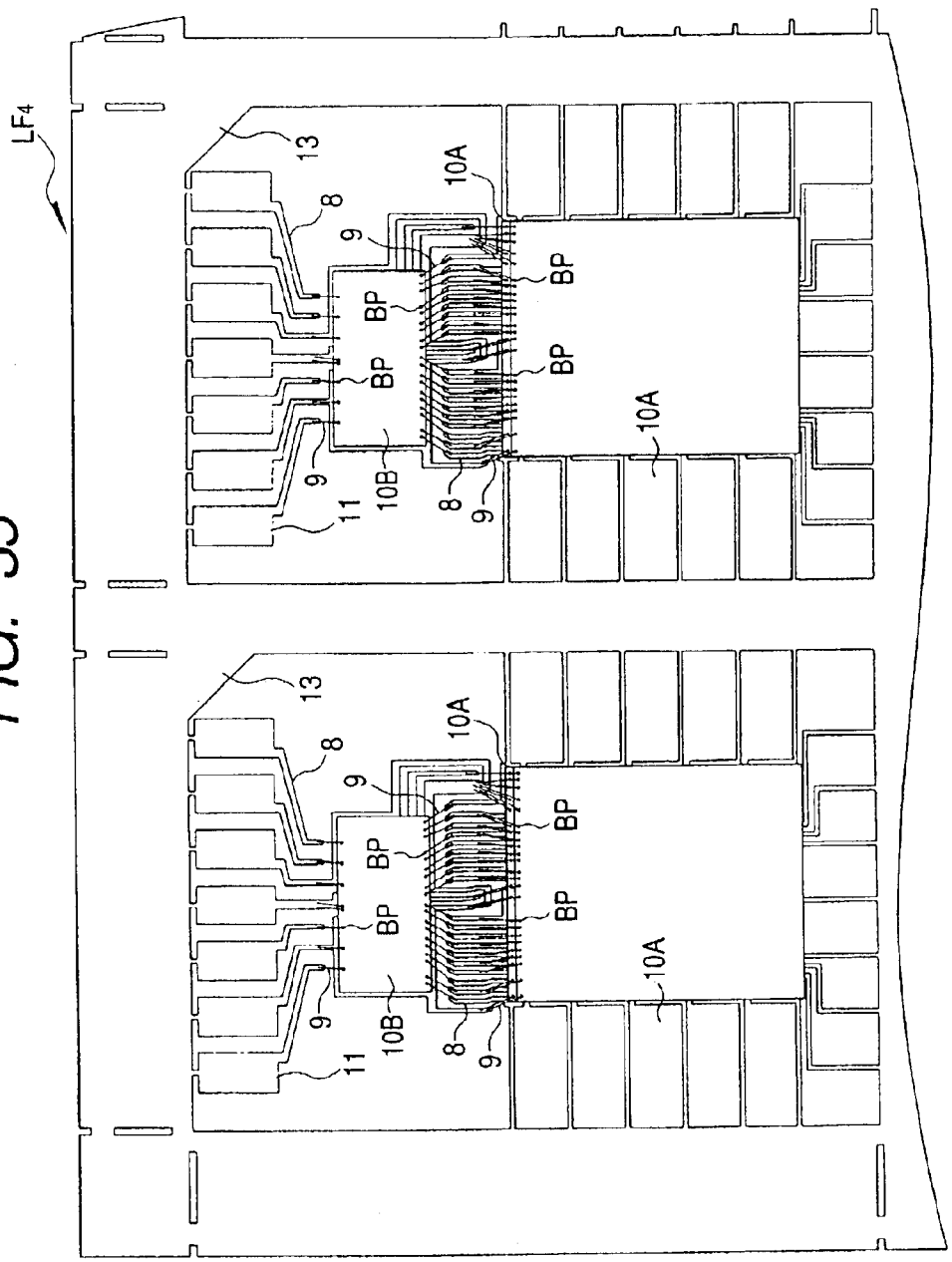
FIG. 35 is an enlarged plan view of the principal portion of the lead frame, showing how to manufacture the memory card of the fourth embodiment.

The following description is now provided about a method for manufacturing a memory card with use of a lead frame $LF_4$ shown in FIG. 34 (a region corresponding to about two memory cards is illustrated). First, as shown in FIG. 35, a memory chip 10A and a control chip 10B are mounted on the lead frame $LF_4$ in the manner described above, then bonding pads BP of the memory chip 10A and bonding pads BP of the control chip 10B are connected respectively with leads 8 through Au wires 9.

Figure 36:
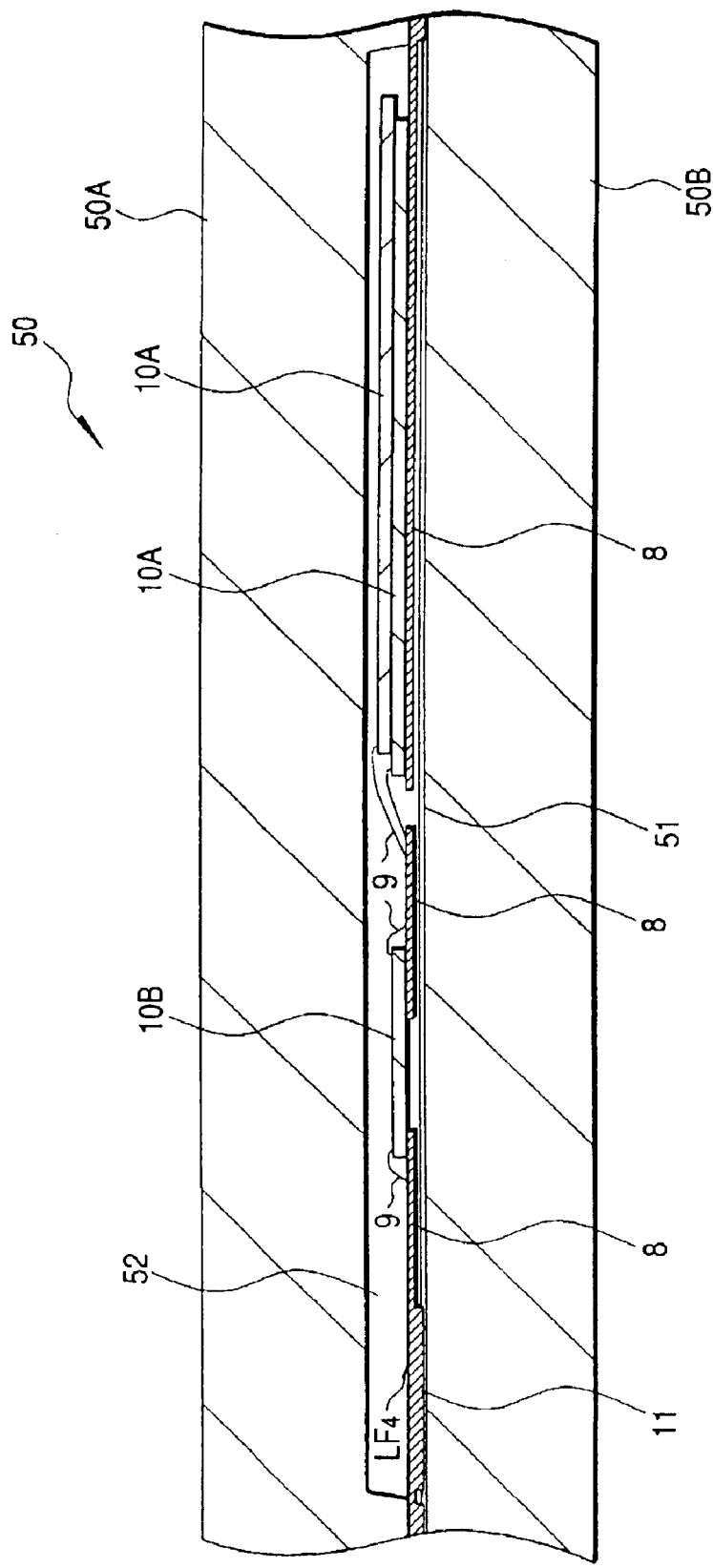
FIG. 36 is an enlarged sectional view of a principal portion of a molding die, showing how to manufacture the memory card of the fourth embodiment.

Next, the lead frame $LF_4$ is loaded into a molding die 50 shown in FIG. 36. The molding die 50 is of a structure wherein the gap between an upper mold 50A and a lower mold 50B is separated product area by product area to form cavities 52 and molten resin is injected into each cavity 52 through a gate (not shown). For loading the lead frame $LF_4$ into the molding die 50, a thin resin sheet 51 is placed on a surface of the lower mold 50B of the molding die 50 and the lead frame $LF_4$ is put on the resin sheet 51, thereafter the resin sheet 51 and the lead frame $LF_4$ are pinched by both upper mold 50A and lower mold 50B.

Figure 37:
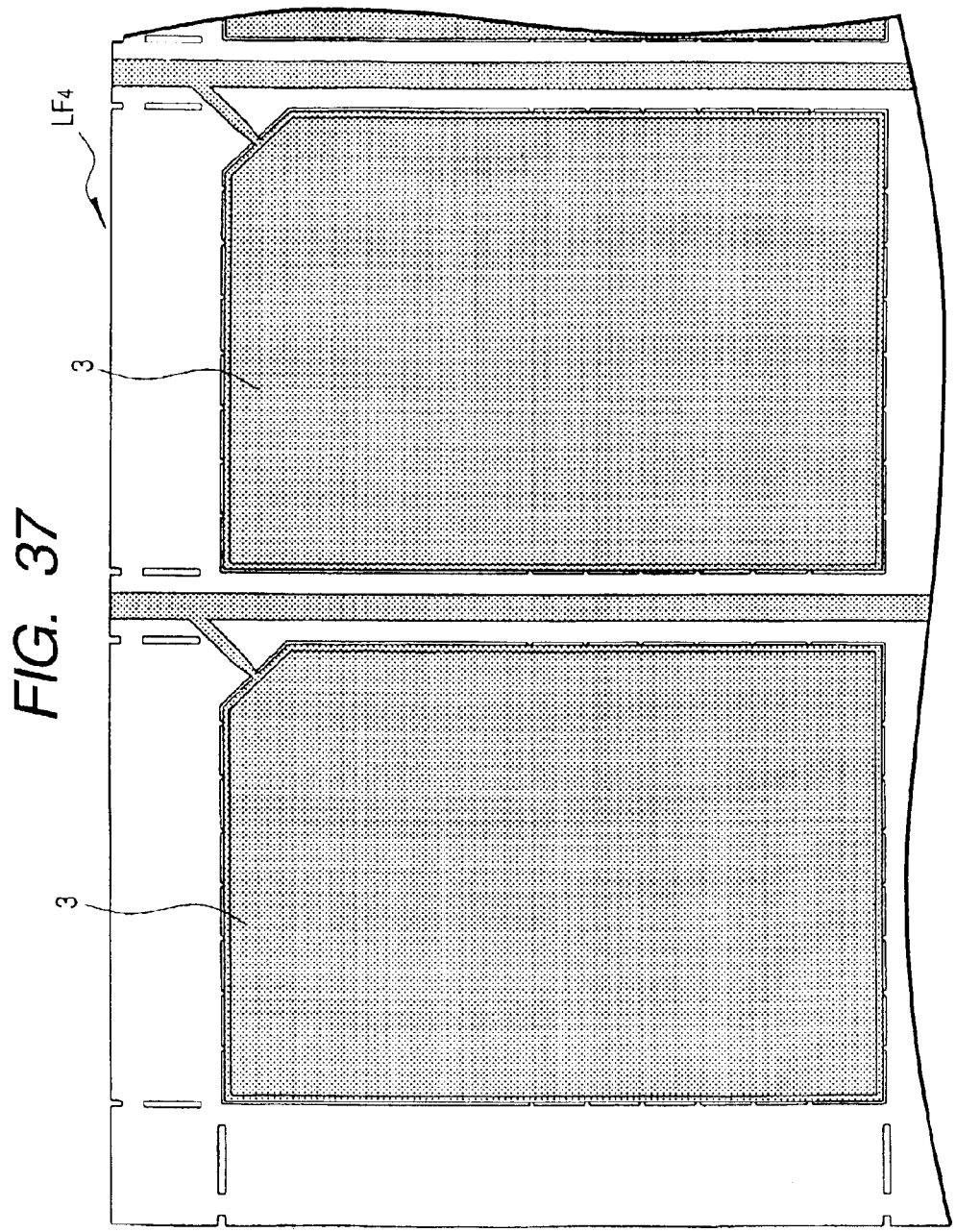
FIG. 37 is an enlarged plan view (surface side) of a principal portion of the lead frame after a molding process, showing how to manufacture the memory card of the fourth embodiment.
Figure 38:
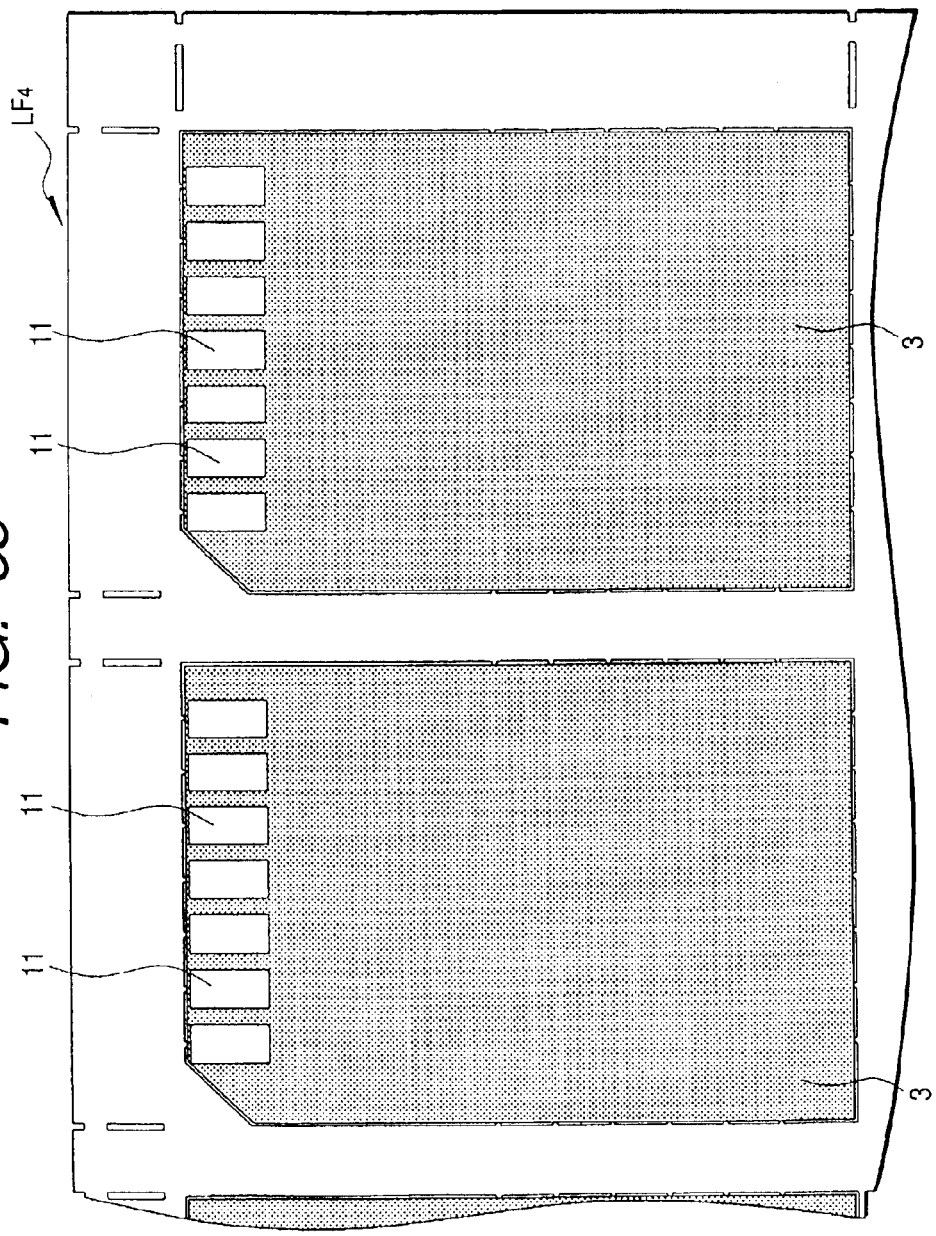
FIG. 38 is an enlarged plan view (back side) thereof.

FIG. 37 is a partial plan view of the lead frame $LF_4$ after injection of molten resin into the cavities 52 of the molding die 50 to form sealing members 3 and subsequent removal of the lead frame from the molding die.

Figure 39:
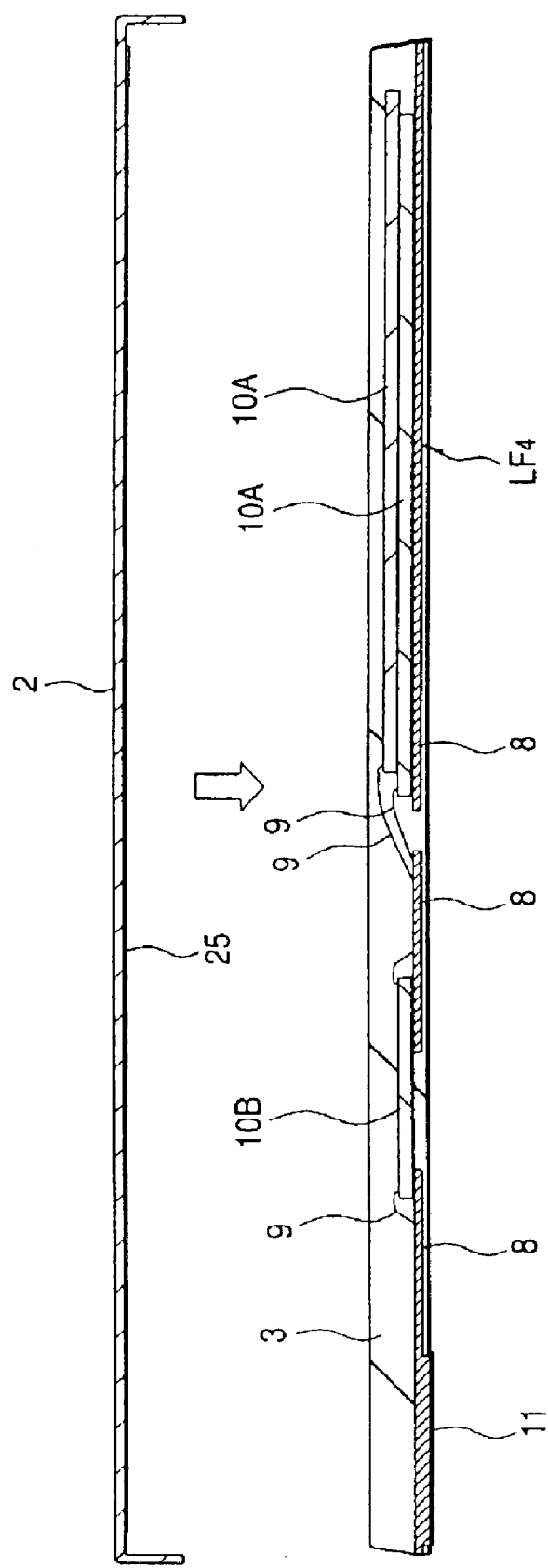
FIG. 39 is a sectional view of a sealing member and a cap, showing how to manufacture the memory card of the fourth embodiment.

Next, the lead frame $LF_4$ is diced using a diamond blade or the like to afford individually diced sealing members 3 as in FIG. 39. Subsequently, the surface of each sealing member 3 is bonded to the back side of a cap 2 with use of a double coated adhesive tape 25 for example to complete the memory card 1A of this embodiment.

According to this fourth embodiment it is possible to improve the memory card manufacturing yield and reduce the memory card manufacturing cost.

Moreover, since a transfer molding process is carried out while pinching a frame portion of the lead frame $LF_4$ located in the vicinity of connecting terminals 11 by both upper mold 50A and lower mold 50B, there is obtained an effect that surfaces of the connecting terminals 11 which surfaces serve as electrodes can be prevented from being covered with resin.

Further, even in case of forming sealing members 3 each having an oblique cutout portion at one corner thereof, since the transfer molding process is carried out by using the molding die 50 which has cavities 52 product area by product area, it is possible to form such sealing members 3 in a more flexible and easy manner by changing the shape of the cavities 52.

Although the present invention has been described above concretely by way of embodiments thereof, it goes without saying that the invention is not limited to the above embodiments, but that various changes may be made within the scope not departing from the gist of the invention.

Although in the above embodiments the present invention has been applied to a multi-media card, the invention is also applicable to memory cards which adopt other standards. Further, the number of semiconductor chips to be mounted on the lead frame and the type of memory can also be changed as necessary.

The following is a brief description of effects obtained by typical modes of the present invention as disclosed herein.

Since the multi-layer wiring substrate used in the conventional memory card is substituted by a metallic lead frame whose thermal expansion coefficient differs from that of the insulating resin to a smaller extent than the difference in thermal expansion coefficient between the multi-layer wiring substrate and the insulating resin, it is possible to decrease the appearance defect rate caused by warping of the memory card and hence possible to improve the memory card manufacturing yield.

Besides, since the multi-layer wiring substrate used in the conventional memory card is substituted by a lead frame whose manufacturing cost is lower than that of the multi-layer wiring substrate, it is possible to reduce the memory card manufacturing cost.

What is claimed is:

1. A memory card comprising:

a lead frame having a front surface and a back surface;

a sealing member which seals one or more semiconductor chips with an insulating resin, the semiconductor chips being mounted on the front surface of the lead frame and connected electrically to leads of the lead frame through wires;

a cap which covers a main surface and side faces of the sealing member; and a resin sheet formed over the back surface of the lead frame;

wherein the lead frame has a connecting terminal portion and another portion, wherein the thickness of the connecting terminal portion is larger than that of the other portion, and wherein the connecting terminal portion is exposed to the exterior through a plane of the resin sheet.

2. A memory card according to claim 1, wherein the semiconductor chips comprise a memory chip and a control chip for controlling the memory chip.

3. A memory card according to claim 2, wherein the memory chips comprise a first memory chip bonded onto the lead frame and a second memory chip bonded onto the first memory chip.

4. A memory card according to claim 1, wherein an insulating tape is bonded to a chip mounting area of the lead frame, and the semiconductor chips are mounted on the insulating tape.

5. A memory card according to claim 1, wherein a groove is formed in the cap, and the sealing member is fitted in the groove.

6. A memory card according to claim 5, wherein the sealing member is fixed to the inside of the groove through an adhesive.

7. A memory card according to claim 1, wherein the connecting terminal portion and the other portion of the lead frame are insulated by the resin sheet.

8. A memory card according to claim 1, wherein the front surface of the connecting terminal portion is in a same plane as the front surface of the other portion.

9. A memory card according to claim 1, wherein the lead frame is not bent.

10. A memory card according to claim 1, wherein an edge of the lead frame is a portion having less thickness than the connecting terminal portion.

11. A memory card according to claim 1, wherein the width of an edge of the lead frame is less than that of the connection terminal portion in plan view.

12. A memory card according to claim 1, wherein the insulating resin is formed between the cap and the connecting terminal portion.

13. A memory card according to claim 1, wherein an edge of the lead frame is covered with the insulating resin.

14. A memory card according to claim 1, wherein an edge of the lead frame is covered with the cap.

* * * * *